United States Patent
Kato

(10) Patent No.: US 6,975,540 B2
(45) Date of Patent: Dec. 13, 2005

(54) SEMICONDUCTOR MEMORY DEVICE FOR DIFFERENTIAL DATA AMPLIFICATION AND METHOD THEREFOR

(75) Inventor: Kenta Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 166 days.

(21) Appl. No.: 10/614,066

(22) Filed: Jul. 8, 2003

(65) Prior Publication Data

US 2004/0008543 A1 Jan. 15, 2004

(30) Foreign Application Priority Data

Jul. 8, 2002 (JP) .............................. 2002-198373

(51) Int. Cl.$^7$ .............................................. G11C 16/06
(52) U.S. Cl. ............................ 365/185.2; 365/185.21; 365/210
(58) Field of Search ........................ 365/185.2, 185.21, 365/205, 207, 208, 210

(56) References Cited

U.S. PATENT DOCUMENTS

| | | | |
|---|---|---|---|
| 5,091,888 A * | 2/1992 | Akaogi ................. | 365/185.21 |
| 6,370,060 B2 * | 4/2002 | Takata et al. .......... | 365/185.21 |
| 6,754,106 B1 * | 6/2004 | Wu et al. ............... | 365/185.2 |

FOREIGN PATENT DOCUMENTS

JP            4-67500            3/1992

* cited by examiner

Primary Examiner—Son Mai
(74) Attorney, Agent, or Firm—Arent Fox PLLC

(57) ABSTRACT

It is intended to provide a semiconductor memory device capable of making margin of readout operation constant regardless of any selected memory cells wherein the number of reference cells is restrained to minimum essential number and reference current value of which depends on a selected memory cell is obtained. A memory cell selected by address Y(X) is connected to a data line DB and data in the memory cell is read out from a memory cell array 3. Then, a differential amplifier 4 amplifies the data with reference to a reference value supplied to a reference line RB from a reference section 2. The reference section 2 is constituted by a reference cell RC and a source resistance adjustor section 1 that is connected to a source terminal of the reference cell RC. A load adjustor section 1 adjusts a resistance value that is connected to the source terminal of the reference cell RC by the address Y(X). A source resistance adjustor section 1 connects a load equivalent to a load selected by a memory cell in accordance with the address Y(X) to the reference cell RC, whereby an appropriate reference value is constantly supplied.

18 Claims, 18 Drawing Sheets

PRINCIPLE DIAGRAM OF PRESENT INVENTION

PRINCIPLE DIAGRAM OF PRESENT INVENTION

FIG. 2 CIRCUIT DIAGRAM OF FIRST EMBODIMENT

CIRCUIT DIAGRAM OF SECOND EMBODIMENT

CIRCUIT DIAGRAM OF THIRD EMBODIMENT

CIRCUIT DIAGRAM OF FOURTH EMBODIMENT

CIRCUIT DIAGRAM OF FIFTH EMBODIMENT

FIG. 7  SCHEMATIC DIAGRAM FOR ILLUSTRATING COLUMN-DIRECTION ADDRESSING IN MEMORY CELL ARRAY OF SIXTH EMBODIMENT

CIRCUIT DIAGRAM OF SIXTH EMBODIMENT

CIRCUIT BLOCK DIAGRAM OF SEVENTH EMBODIMENT

FIG. 10 TRANSISTOR CHARACTERISTIC OF SEVENTH EMBODIMENT

FIRST VARIANT DIRECTED TO SEVENTH EMBODIMENT

SECOND VARIANT DIRECTED TO SEVENTH EMBODIMENT

CIRCUIT BLOCK DIAGRAM OF EIGHTH EMBODIMENT

SPECIFIC EXAMPLE DIRECTED TO EIGHTH EMBODIMENT

CIRCUIT BLOCK DIAGRAM OF VARIANT DIRECTED TO EIGHTH EMBODIMENT

FIG. 16 FIRST SPECIFIC EXAMPLE OF VARIANT DIRECTED TO EIGHTH EMBODIMENT

FIG. 17 SECOND SPECIFIC EXAMPLE OF VARIANT DIRECTED TO EIGHTH EMBODIMENT

CONVENTIONAL REFERENCE SECTION

SEMICONDUCTOR MEMORY DEVICE FOR DIFFERENTIAL DATA AMPLIFICATION AND METHOD THEREFOR

CROSS-REFERENCE TO RELATED APPLICATIONS

This application is based upon and claims the benefit of priority from each of the prior Japanese Patent Application No. 2002-198373 filed on Jul. 8, 2002, the entire contents of which are incorporated herein by reference.

BACKGROUND OF THE INVENTION

1. Field of the Invention

The present invention relates to differential amplification of a semiconductor memory device. More particularly, it relates to a semiconductor memory device that amplifies memory data by comparing between readout-data and a reference value of a reference cell.

2. Description of Related Art

In a semiconductor memory device such as flash memory or the like, storing of data is determined by current drivability of non-volatile transistors provided with a memory cell array arranged in a matrix form. That is, data "1"/"0" correspond to difference such as that a non-volatile transistor allows current "to flow"/"not to flow", or a non-volatile transistor allows "even more current"/"even less current" to flow, respectively, and the like.

Data stored in a non-volatile semiconductor memory device is sensed in such a manner that a memory cell is selected from a memory cell array arranged in a matrix form, and large-small relation is detected between two kinds of current values, namely, current that flows to ground voltage VSS from a digit line connected to the selected memory cell through the memory cell and reference current that flows to the ground voltage VSS from a reference digit line through a reference cell. In this situation, a current path between a memory cell and the ground voltage VSS differs from position by position of memory cells. Accordingly, different values of wiring resistance are applied to respective current paths as source resistance of respective non-volatile transistors for memory cells. Since source resistance works to restrict current drivability of a non-volatile transistor, current characteristics of memory cells are determined by difference of source resistance value.

Conventionally, there has been devised structure to resolve the above-described problem. For example, as shown in FIG. 18, Japanese Laid-open Patent Publication No. 4-67500 discloses a reference section 1000 that comprises: reference cells RC100, RC101, RC102, and RC103 each of which is connected to a line having the same value of resistance in comparison with that of wiring resistance of the current path between a memory cell and the ground voltage VSS; and decode circuits 300, 301, 302, and 303 which are controlled by column decode signals Y100, Y101, Y102, and Y103, respectively so as to select a reference cell positioned in a column address column of which is same as column of a selected memory cell. In the reference section 1000, a reference cell positioned in a column address column of which is same as column of a selected memory cell is selected and a wiring resistance to the ground voltage VSS of the selected memory cell and that of the reference cell are same. Accordingly, there is obtained reference current a value of which depends on a selected memory cell so that margin of readout operation can be uniform regardless any memory cells.

However, in the memory cell region of the conventional reference section 1000, there are required reference cells as many as memory cells arranged in a line. Such structure arises a problem such that as memory volume of a semiconductor memory device is increased, the number of reference cells must be increased. There will be listed problems of such structured reference cells in detail.

Redundancy structure may be provided for malfunction of memory cells. However, due to limitation of chip area in a semiconductor memory device, it is generally difficult to provide redundancy structure for reference cells in the device. Therefore, as the number of reference cells increases, rate of malfunction of the reference cells becomes higher. This lowers yield of non-defective, which is problematic. In case redundancy structure for reference cells is provided, circuit scale of a reference section becomes large. This makes chip size larger, which is problematic.

Although wiring resistances of non-volatile transistors, applied as source resistance, are balanced, the number of reference cells is increased. As a result, characteristic variation among the reference cells or between reference cells and memory cells becomes large and margin of readout operation in a manner of current comparison decreases. Aspects as such are problematic to a reference section.

In outgoing inspections, program operation must be conducted for each reference cell so as to adjust threshold voltage of each reference cell. The more reference cells are provided, the longer time for adjustment of threshold voltage and time for inspection are required, which is problematic.

Furthermore, circuit scale of a decode circuit must be made larger so as to select many reference cells. Additionally, the number of column decode signals to be sent to the decode circuit as control signal increases. As a region for the decode circuit and a wiring region for the column decode signal become large, chip size becomes larger naturally, which is problematic.

Furthermore, flash memories or the like have various operation modes such as erase verification (ERV, hereinafter), program verification (PGMV, hereinafter), readout operation (READ, hereinafter), and the like. Reference cells different in threshold voltage value are required for each operation mode. Since a set of reference cells as many as the number of addresses arranged in a column of memory cell array is required for each operation mode, a large number of cells are required as total number of reference cells. In addition to an area for a decode circuit and wirings of column decode signal, a large area is required for cells, which makes chip size large. What is more, characteristic variation among reference cells becomes large, whereby outgoing inspection time becomes significantly long. Those aspects are problematic.

SUMMARY OF THE INVENTION

Accordingly, it is an object of the present invention to provide a semiconductor memory device and a control method thereof capable of making margin of readout operation constant regardless of any memory cells wherein the number of reference cells is restrained to minimum essential number and reference current value of which depends on a selected memory cell is obtained.

To achieve the object, according to one aspect of the present invention, there is provided a semiconductor memory device that differentially amplifies data readout from a memory cell with reference to a reference value when data is read out, the semiconductor memory device comprising: a reference cell; and a load adjustor section that adjusts a first load connected to the reference cell in accordance with a selected address of the memory cell; wherein the first load is adjusted with reference to a second load on a data path of the memory cell selected in accordance with the selected address.

Furthermore, there is provided a control method of a semiconductor memory device, directed to the one aspect of the present invention, comprising the steps of: a step for reading out data from a memory cell, and a step for differentially amplifying the data read out from the memory cell with reference to a reference value read out from a reference cell; wherein the reference value is adjusted by adjusting a first load connected to the reference cell with reference to a second load on a data path of the memory cell selected by a selected address.

In the semiconductor memory device and control method of the semiconductor memory device both directed to the one aspect of the present invention, there is applied differential amplification to data read out from a memory cell selected by a selected address with reference to a reference value supplied from a reference cell. At this stage, in response to a second load on a data path of the selected memory cell, a first load adjusted by a load adjustor section based on the selected address is connected to a reference cell.

Thereby, the first load is adjusted in accordance with a selected address with the number of reference cells being minimum essential. There can be supplied appropriate reference values to respective memory cells.

Since the number of the reference cells is suppressed to a minimum essential, rate of malfunctioned reference cells can be reduced. Even though there is no redundancy structure for reference cells, lowering of yield due to high-rate of malfunctioned reference cells can be suppressed. Furthermore, there is no fear of large-sized chip design accompanied by redundancy structure for reference cells.

Furthermore, since the number of reference cells is suppressed to a minimum essential, characteristic variations of respective reference cells can be suppressed to minimum even if a plurality of reference values are generated. Thereby, there can be structured with reference cells of a very little operation characteristic variations. Furthermore, since variations of respective reference values are suppressed minimum, margin of readout operation can be secured.

Furthermore, in outgoing inspections, adjustment of threshold voltage for each reference cell can be completed in a minimum essential time. Thereby, there can be shortened test time.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
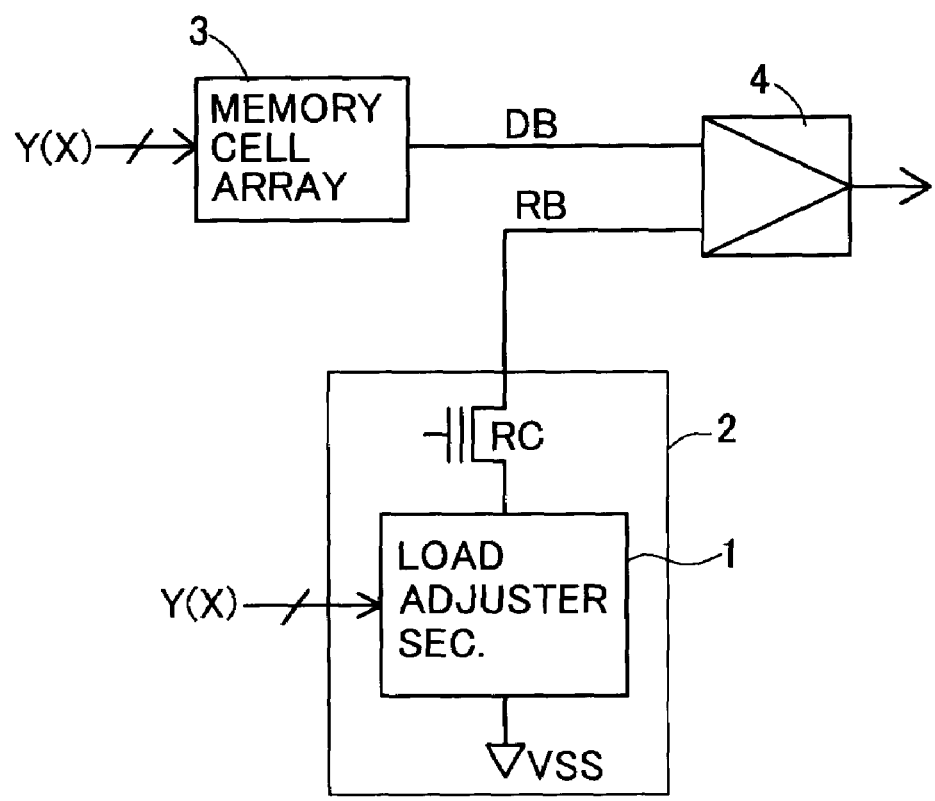
FIG. 1 is a principle diagram of the present invention.

FIG. 1 shows a principle diagram of the present invention. A memory cell selected from a memory cell array 3 in accordance with address Y(X) is connected to a data line DB to readout data. Data readout to the data line DB is compared with a reference value to be supplied to a reference line RB from a reference section 2 and difference of the two values is differentially amplified by a differential amplifier 4.

A reference section 2 is constituted by a reference cell RC and a load adjustor section 1 that is connected to a source terminal of the reference cell RC. Regarding the load adjustor section 1, load to be connected to the source terminal of the reference cell RC is adjusted by address Y(X) that selects a memory cell in the memory cell array 3. The load adjustor section 1 adjusts load to be connected to a source terminal of a reference cell RC depending on level of load to be connected to a source terminal of each memory cell in accordance with arrangement manner of memory cells in the memory cell array 3.

Thereby, load level of which is equivalent to load connected to a source terminal of a memory cell selected by address Y(X) can be connected to a source terminal of a reference cell RC and an appropriate reference value can be supplied constantly depending on selected memory cell.

Next, first through eighth embodiments of the inventive semiconductor memory device will be described by referring to FIGS. 2 through 17. As examples of the inventive semiconductor memory device, the first through eighth embodiments describe non-volatile memories.

Figure 2:
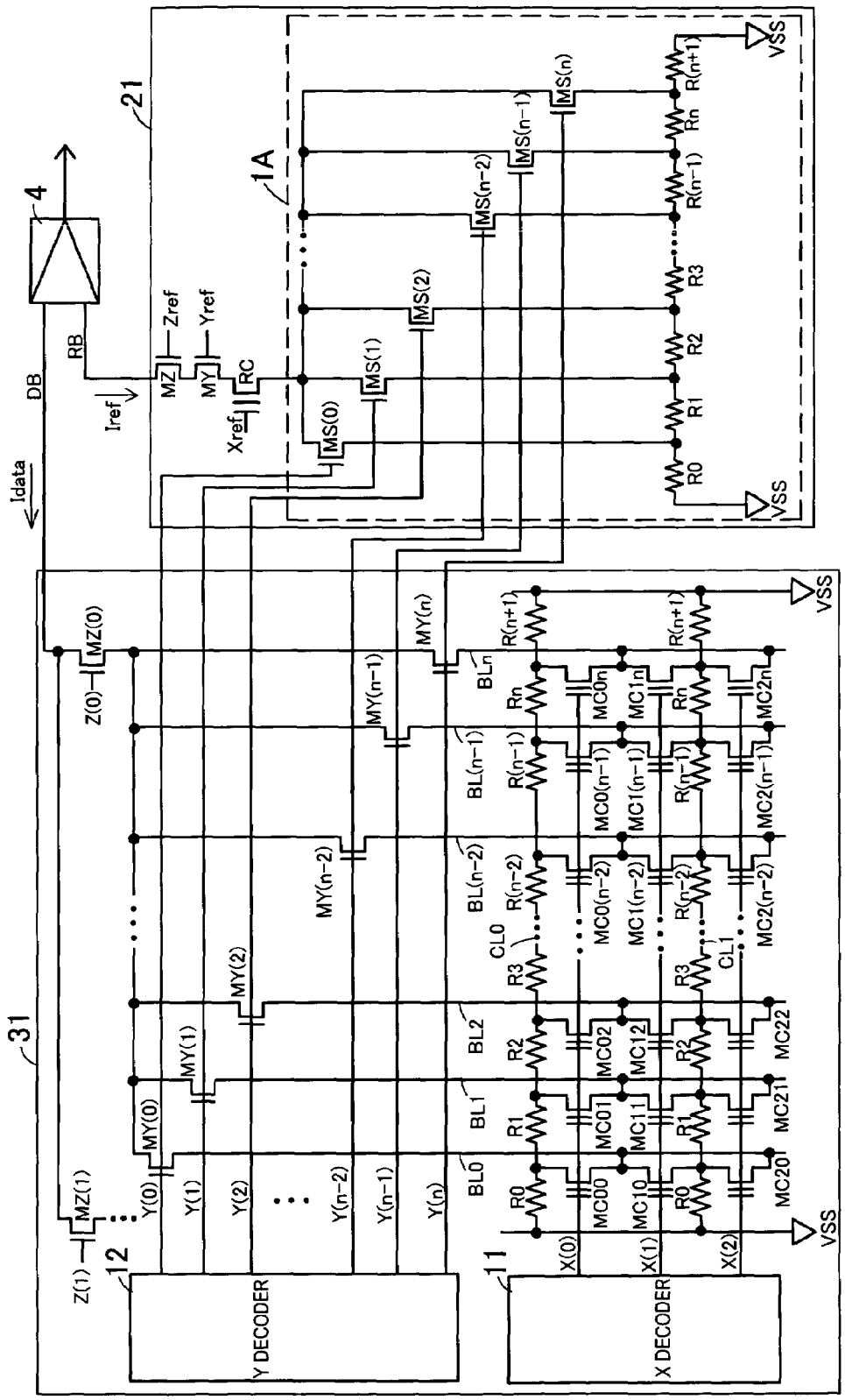
FIG. 2 is a circuit diagram of a first embodiment.

In FIG. 2 that shows a circuit diagram of a first embodiment, a data line DB for connecting a memory cell array 31 and a differential amplifier 4 is provided as data path DB of data current Idata and a reference line RB for connecting a reference section 21 and the differential amplifier 4 is provided as a path of reference current Iref.

In the memory cell array 31, non-volatile transistors MC00 through MC2n are arranged in a matrix form as memory cell. In row direction, row addresses X(0), X(1), X(2) decoded by a X decoder 11 are connected to gate terminals of non-volatile transistor groups MC00 through MC0n, MC10 through MC1n, and MC20 through MC2n, respectively.

Drain terminals of the non-volatile transistors are commonly connected between transistors adjacent to each other in a row address transition direction such as between row addresses X(0) and X(1) in FIG. 2, and the transistors in the row direction are identified by column addresses Y(0) through Y(n). Drain terminals of respective transistors MCx0 through MCxn are connected to bit lines BL0 through BLn, respectively. It should be noted that x=0, 1, and 2, herein.

Source terminals of the non-volatile transistors are commonly connected between transistors adjacent to each other in a row address transition direction such as between row addresses X(1) and X(2) in FIG. 2, and the commonly-connected source terminals are further commonly connected to common lines CL0 and CL1 in column address transition direction. Both ends of the respective common lines CL0 and CL1 are connected to reference voltage VSS. In FIG. 2, resistances R0 through R(n+1) are provided between two connection points of two source terminals adjacent to each other in a column address transition direction or between one of the ends of the common line CL0 or CL1 and a connection point adjacent to the one of the ends. It should be noted that those resistances are merely indicative of wiring resistance existing at the common lines CL0 and CL1 but, actually, resistance elements are not connected thereto.

The bit lines BL0 through BLn are connected to source terminals of MOS transistors MY(0) through MY(n), respectively, gate terminals of which are controlled by column addresses Y(0) through Y(n) outputted from a column decoder 12. Drain terminals of the MOS transistors MY(0) through MY(n) are commonly connected to one another and the commonly-connected drain terminals is connected to a source terminal of a MOS transistor MZ(0). The column addresses Y(0) through Y(n) select one of the bit lines BL0 through BLn to select a non-volatile transistor that corresponds to the selected bit line. A drain terminal of the MOS transistor MZ(0) is commonly connected to a drain terminal of a MOS transistor MZ(1), whereby, a data line DB is constituted. Signals Z(0) and Z(1) for controlling gate terminals of the MOS transistors MZ(0) and MZ(1), respectively, are equivalent to sector addresses, for example, as well as signals for selecting sectors that are subject to data access in the memory cell array 31.

In case data is read out from a memory cell in the memory cell array 31, a non-volatile transistor that stores the data to be read out is selected by selecting each one of the three kinds of addresses, namely, the row addresses X(0) through X(2), the column addresses Y(0) through Y(n) and the sector addresses Z(0) and Z(1). Hereinafter, provided that an address Z(0) is selected as a sector address, data readout operation will be described.

When one of the row addresses X(0), X(1), and X(2) is selected, there is selected one of the corresponding row directional non-volatile transistor groups MC00 through MC0n, MC10 through MC1n, and MC20 through MC2n. Thereby, a current path between the bit lines BL0 through BLn and reference voltage VSS is established through the selected transistor group. Next, one of the column addresses Y(0) through Y(n) is selected so as to select one of the bit lines BL0 through BLn connected to reference voltage VSS. Thereby, a current path from the data line DB to reference voltage VSS is established through one of the MOS transistors MZ(0), MY(0) through MY(n) and a non-volatile transistor that corresponds to the MOS transistor.

It should be noted that routing of a current path of the common line CL0 or CL1, which reaches reference voltage VSS from a non-volatile transistor, differs depending on a selected column address among Y(0) through Y(n).

For example, in case a column address Y(0) is selected, there are two paths to reach reference voltage VSS from the common line CL0 or CL1: (1) through a resistance R0; and (2) through a group of resistances R1 through R(n+1). In that case, a resultant resistance value is:

$$R(Y0)=R0//(R1+\ldots+R(n+1))$$

In case a column address Y(1) is selected, there are two paths to reach reference voltage VSS from the common line CL0 or CL1: (1) through resistances R0 and R1; and (2) through a group of resistances R2 through R(n+1). In that case, a resultant resistance value is:

$$R(Y0)=(R0+R1)//(R2+\ldots+R(n+1))$$

Similar to the above cases, a resistance value to be connected between a non-volatile transistor and reference voltage VSS differs depending on a selected column address.

Since a resistance value to be connected is source resistance of a non-volatile transistor, there arises a problem such that voltage-current characteristic of a non-volatile transistor fluctuates when data current Idata flows through the non-volatile transistor. The more current flows, the larger voltage drop due to source resistance becomes, whereby voltage bias to the non-volatile transistor is likely to decrease. Degree of this effect differs depending on position of a selected non-volatile transistor. Therefore, it is required to cancel out fluctuation effects due to wiring resistance of the common lines CL0 and CL1 by correcting level of reference current Iref depending on a position a non-volatile transistor, i.e., a column address among Y(0) through Y(n).

The reference section 21 realizes function of canceling out fluctuation effects due to wiring resistance of the common lines CL0, CL1 for the memory cell array 31 with just one reference cell RC that is minimum essential.

The reference line RB is connected to a MOS transistor MZ equivalent to the MOS transistor MZ(0) or MZ(1) that is selected by the sector address Z(0) or Z(1), respectively. The MOS transistor MZ is connected to a MOS transistor MY equivalent to any one of MY(0) through MY(n) that is selected by corresponding one of the column addresses MY(0) through MY(n). A gate terminal of the MOS transistor MZ and that of the MOS transistor MY are controlled by Zref signal and Yref signal, respectively. Signals that are activated as Zref signal and Yref signal in response to data-readout may be used so that the MOS transistors MZ and MY can be controlled in synchronous with data-readout. Level of the Zref signal and Yref signal may be fixed to power source voltage VCC so that the MOS transistors MZ and MY can be kept in ON-state. No matter which method as indicated in the above may be used, the MOS transistors MZ and MY can be loads equivalent to the MOS transistor MZ(0) or MZ(1) and the MOS transistors MY(0) through MY(n) in the memory cell array 31.

The MOS transistor MY is connected to a drain terminal of the reference cell RC that is controlled by an Xref signal. The reference cell RC is a non-volatile transistor that is equivalent to one of many non-volatile transistors of memory cells arranged in the memory cell array 31. Generally, each non-volatile transistor arranged in the memory cell array 31 is constituted with characteristic equivalent to each other in terms of transistor characteristic. Therefore, a reference cell RC can be constituted with only one non-volatile transistor. Here, an Xref signal may be a signal activated in response to data-readout, similar to a Yref signal and a Zref signal or may be a fixed voltage signal such as power source voltage VCC.

A source terminal of the reference cell RC is connected to reference voltage VSS through a load adjustor section 1A. That is, the load adjustor section 1A works to cancel out fluctuation effects due to wiring resistances of the common line CL0 or CL1 at the memory cell array 31.

The source terminal of the reference cell RC is controlled by the column addresses Y(0) through Y(n) and connected to each drain terminal of selection transistors MS(0) through MS(n) that constitute a selector section. Each source terminal of the selection transistors MS(0) through MS(n) is connected to each terminal of load elements that constitute a load element group. The load element group has structure equivalent to the structure between the common lines CL0 or CL1 in terms of resistances R0 through R(n+1) connected in series between reference voltage VSS. Each terminal of the load elements in the load element group corresponds to each connection point of the common lines CL0 or CL1, and the load element group is structured such that a resistance value from a certain terminal to reference voltage VSS is equivalent to a resistance value from a certain connection point to reference voltage VSS.

The resistances R0 through R(n+1) that constitute the load element group can be structured with resistance elements that have resistance values equivalent to respective resistances R0 through R(n+1) of the common lines CL0 or CL1. Furthermore, the resistances R0 through R(n+1) can be structured with wiring material that has wiring resistance equivalent to the common lines CL0 or CL1 in same wiring manner and length, instead of resistance elements or the like. Furthermore, the resistances R0 through R(n+1) can be constituted with the above mentioned resistance elements and the wiring material.

Furthermore, one of the selection transistors MS(0) through MS(n) in the selector section and one of the MOS transistors MY(0) through MY(n) in the memory cell array 31 are selected by a same numbered column address among Y(0) through Y(n). Therefore, a resistance connected to a source terminal of a non-volatile transistor for a memory cell that is selected by a column address and a resistance connected to a source terminal of a reference cell RC are constantly equivalent regardless of any column addresses.

Wiring resistance at a data path for data current Idata and a path for reference current Iref are constantly kept equivalent. Therefore, there flow data current Idata and reference current Iref as current difference depending on voltage-current characteristic difference between a non-volatile transistor for a memory cell set to threshold voltage depending on data written there and a reference cell RC set and kept to threshold voltage for reference current Iref. Current difference differentially amplified by the differential amplifier 4 for data-readout is reflective of voltage-current characteristic difference between the two transistors regardless of any selected memory cells, whereby enough margin of readout operation can be secured constantly.

In this embodiment, it is described that ON resistance of the selection transistors MS(0) through MS(n) that constitute the selector section is significantly little and is negligible against the resistances R0 through R(n+1) added to the common lines CL0, CL1 and the load element group. However, the memory cell array 31 constituted by non-volatile transistors is generally used for erase operation and program operation, in addition to readout operation. Accordingly, for some operation modes, voltage to be applied to source terminals of non-volatile transistors must be set to voltage other than reference voltage VSS. For that purpose, MOS transistors (not shown) must be arranged between the common lines CL0, CL1 and reference voltage VSS so as to control voltage to be applied to source terminals of non-volatile transistors through the common lines CL0, CL1. Therefore, ON resistances of the MOS transistors are inserted in paths from the common lines CL0, CL1 to reference voltage VSS and the ON resistances and those of the selection transistors MS(0) through MS(n) may be set to equivalent resistance values so as to make resistance values on these current paths same.

According to the first embodiment, although the number of reference cells RC to be arranged on the reference section 21 is one, a minimum essential, load of the load adjustor section 1A as first load is adjusted depending on the column addresses Y(0) through Y(n) so that reference current Iref appropriate to each memory cell can be supplied.

Since the number of the reference cells RC is one, a minimum essential, rate of malfunctioned reference cell can be reduced. Even though there is no redundancy structure for the reference section 21, lowering of yield due to high-rate of malfunctioned reference cell RC can be suppressed. Furthermore, there is no fear of large-sized chip design accompanied by redundancy structure for the reference section 21.

Furthermore, since the number of reference cells arranged in the reference section 21 is suppressed to a minimum essential, even if there are a plurality of reference sections, characteristic variations of respective reference cells can be suppressed to minimum. Thereby, there can be structured with reference cells of a very little operation characteristic variations. Furthermore, since variations of reference current Iref for each reference section are suppressed minimum, margin of readout operation can be secured.

Furthermore, in outgoing inspections, adjustment of threshold voltage for each reference cell can be completed in a minimum essential time. Thereby, there can be shortened test time.

Furthermore, depending on the second load as source resistance of the non-volatile transistors for the memory cells, the first load can be connected as source resistance of the reference cell RC. Electric state of source terminals, the basis of operational characteristic of memory cells and reference cell, can be adjusted to predetermined state regardless of source resistance that differs from each memory cell. Reference current Iref suitable to readout data from a memory cell can be supplied constantly.

In case the memory cells and reference cell are structured with voltage control transistors such as MOS transistors or the like, bias voltage of the transistors fluctuate depending on source current flowing through source resistance and as a result, operational characteristic such as voltage-current characteristic or the like may change. However, since the first load depending on source resistance of a memory cell is connected to a source terminal of a reference cell there can be established relativity between fluctuation quantity of bias voltage to a memory cell and that of bias voltage to a reference cell.

Furthermore, even if paths leading to reference voltage VSS that is the common terminal from each connection point on the common lines CL0 or CL1 differs by respective memory cells, the resistances R0 through R(n+1) constituting load element group have load distribution equivalent to the common lines CL0 or CL1. Furthermore, since a corresponding connection point is selected by the selected transistors MS(0) through MS(n) in response to a selected address, even if connection points of the common lines CL0 or CL1 differ by each memory cell, a reference cell RC is connected to a connection point of the load element group that has first load corresponding to second load to be connected to a memory cell.

Effects so far described hold true in second through eighth embodiments that will be described hereafter.

Figure 3:
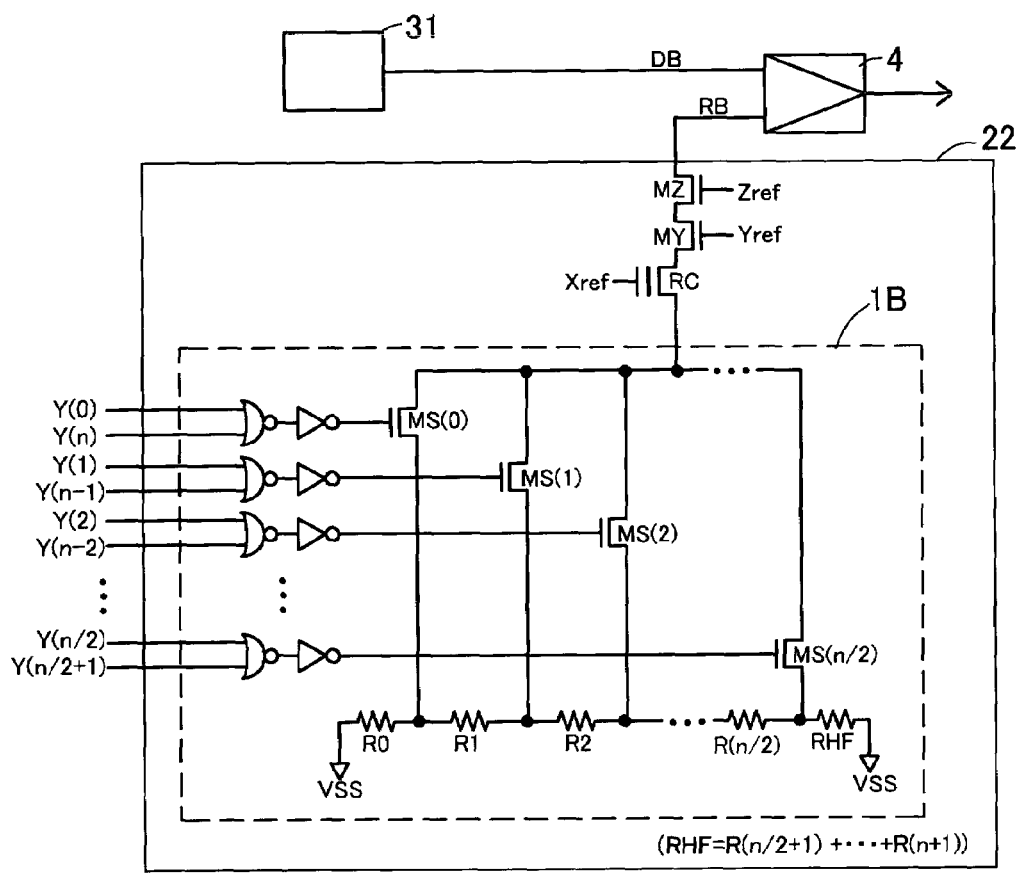
FIG. 3 is a circuit diagram of a second embodiment.

A second embodiment as shown in FIG. 3 has a reference section 22 including a load adjustor section 1B, instead of the reference section 21 of the first embodiment.

The load adjustor section 1B has resistances R0 through R(n/2) and RHF as a load element group, instead of the resistances R0 through R(n+1) that constitute a load element group of the load adjustor section 1A (FIG. 1). It should be noted that the resistance RHF is expressed such that RHF=R(n/2+1)+ ... +Rn. That is, as load element group, there are provided the resistances R0 through R(n/2) equivalent to resistances R0 through R(n/2) to halfway points of the common line CL0 or CL1 as well as the resistance RHF, a compressed form of latter halfway points for resistances R(n/2+1) through Rn. Connection points for the common line CL0 or CL1 are arranged with constant interval taken. Therefore, each of the resistances R0 through R(n/2) between connection points of the common line has an equivalent resistance value and this is applicable to a case that resistances R0 and R(n+1) at both ends of a resistance array has an equivalent resistance value.

Each of the terminals between respective load elements R0 through RHF in the load element group is connected to selection transistors MS(0) through MS(n/2) and then, selectively connected to a reference cell RC. Each of the connection points for the common line CL0 or C11 is arranged with constant interval taken, and looking from a connection point same distance from both ends, there spread two of identical structure to both ends. Therefore, control signals of the selection transistors MS(0) through MS(n/2) for connecting to each of the terminals adjacent to load elements R0 through R(n/2) in the load element group are supplied as OR signals of (Y(0) and Y(n)), (Y(1) and Y(n−1)), (Y(2) and Y(n−2)), ... , (Y(n/2) and Y(n/2+1)), column address pairs that select a connection point same distance from both ends of the common line CL0 or CL1, and selected in response to one of the paired addresses.

According to the second embodiment, there can be obtained further effects as follows. Specifically, in case a memory cell is connected to the common line CL0 or CL1 with same interval taken, the number of composing elements directed to selector section and the load element group of the reference section 22 can be reduced to almost half of the first embodiment. Thereby, the load adjustor section 1B can be structured with compact circuit design. That is, with small-sized circuit structure, there can be structured the reference cell section 22 capable of constantly securing sufficient margin of data readout without accounting on positioning strategy of memory cells.

Figure 4:
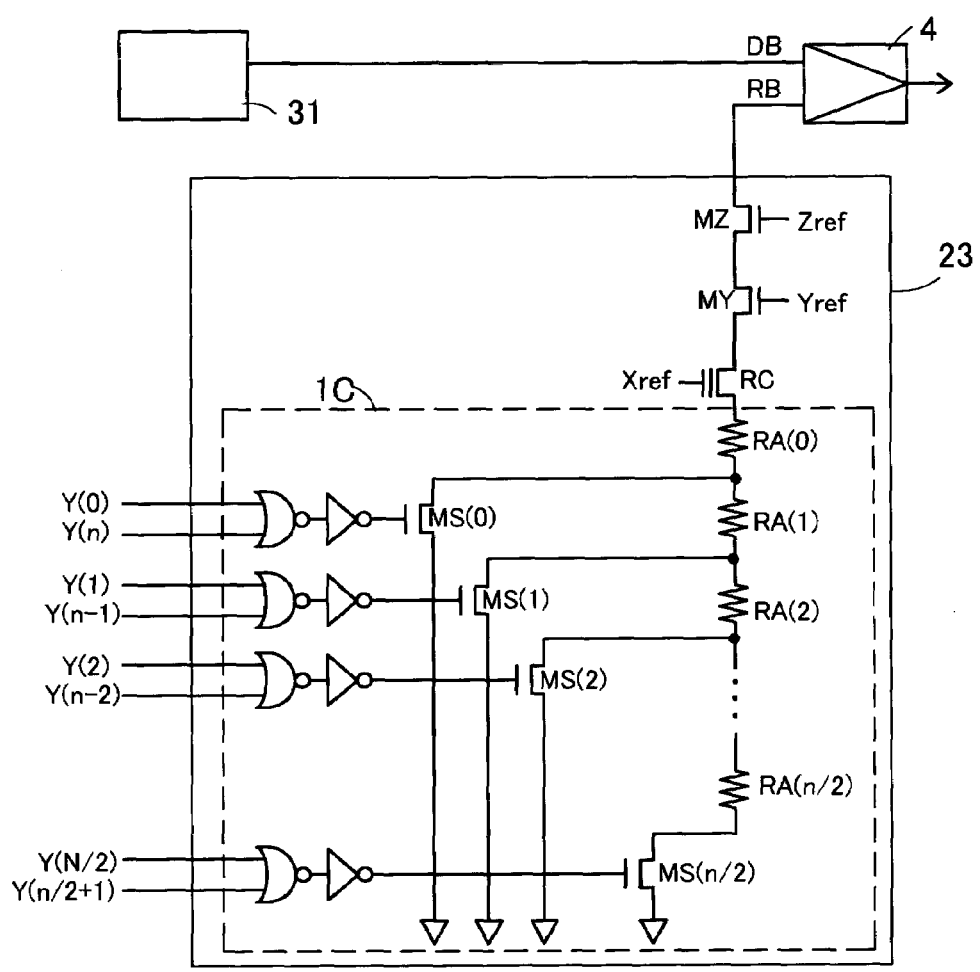
FIG. 4 is a circuit diagram of a third embodiment.

A third embodiment as shown in FIG. 4 has a reference section 23 including a load adjustor section 1C, instead of the reference section 22 of the second embodiment (FIG. 3).

The load adjustor section 1C includes resistances RA(0) through RA(n/2) connected in serial between a reference cell RC and reference voltage VSS as load element group, instead of the resistances R0 through R(n/2) and RHF arranged between reference voltage VSS in the load element group of the load adjustor section 1B (FIG. 3). Furthermore, selection transistors MS(0) through MS(n/2−1) are arranged between each of the terminal adjacent to the resistances RA(0) through RA(n/2) and reference voltage VSS and a selection transistor MS(n/2) is arranged between other terminal of the resistance RA(n/2) and reference voltage VSS. Gate terminals of the selection transistors MS(0) through MS(n/2) are controlled similar in a same manner as the second embodiment. Similar to the second embodiment, in the third embodiment, each connection point of the common line CL0 or CL1 is arranged with constant interval taken. Therefore, resistances R1 through Rn existing between adjoining connection points have a same resistance value and this embodiment is applicable to a case that resistances R0 and R(n+1) at both ends have a same resistance value.

Each of the resistances RA(0) through RA(n/2) in the load element group is connected by adding thereto in order depending on distance of its connection point from both ends of the common line CL0 or CL1. That is, for example, a resistance RA(0) is selected for a column address Y(0) or Y(n) and it is expressed such that: RA(0)=R(Y0)=R0//(R1+ ... +R(n+1)). For a column address Y(1) or Y(n−1), resistances RA(0) and RA(1) are connected and it is expressed such that: RA(0)+RA(1)=R(Y1)= (R0+R1)//(R2+ ... +R(n+1)). For a column address Y(2) or Y(n−2), resistances RA(0) through RA(2) are connected and it is expressed such that: RA(0)+RA(1)+RA(2)=R(Y2)= (R0+R1+R2)//(R3+ ... +R(n+1)).

Figure 5:
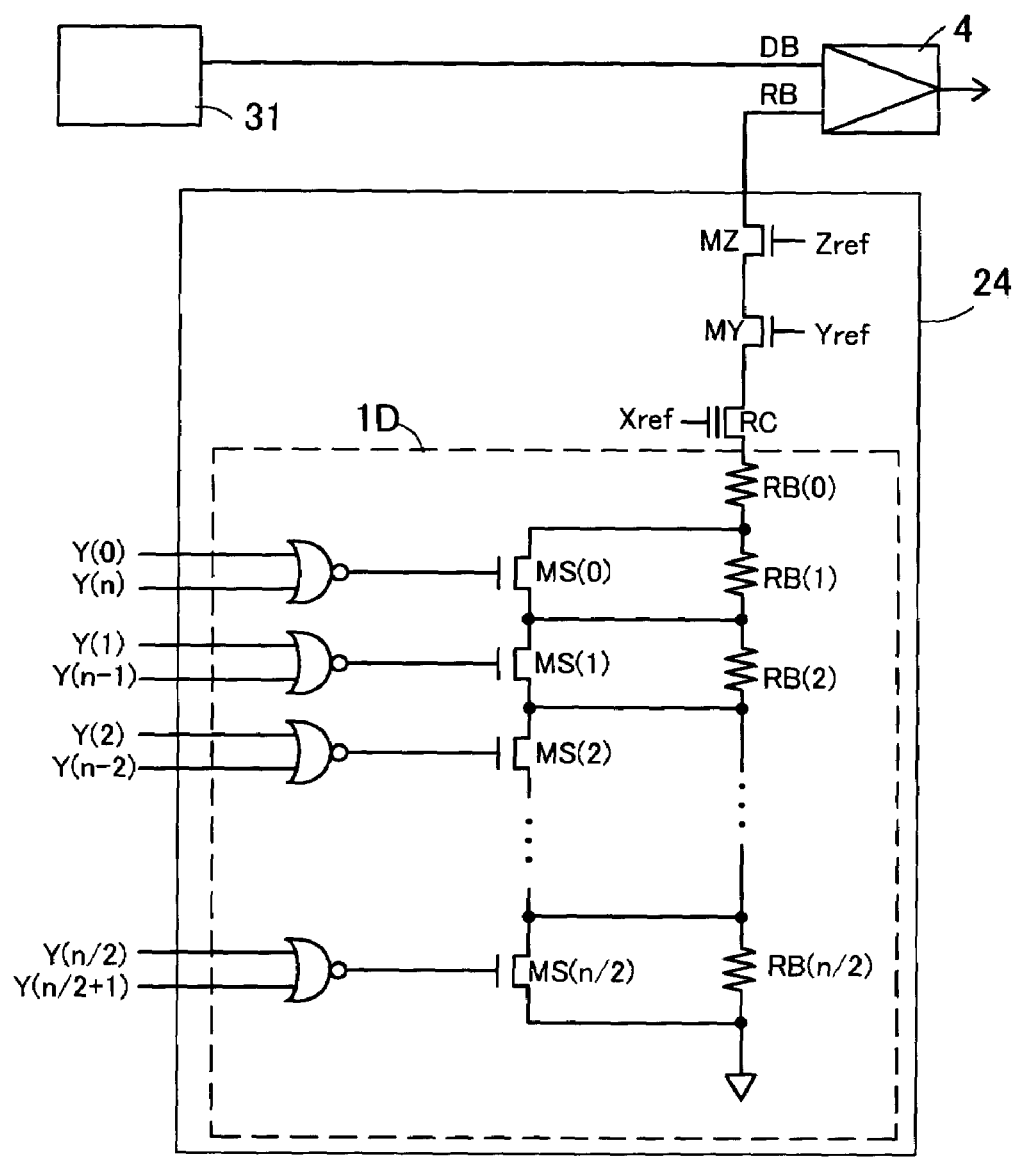
FIG. 5 is a circuit diagram of a fourth embodiment.

A fourth embodiment as shown in FIG. 5 has a reference section 24 including a load adjustor section 1D, instead of the reference section 23 of the third embodiment (FIG. 4).

The load adjustor section 1D includes resistances RB(0) through RB(n/2) as load element group, instead of the resistances RA(0) through RA(n/2) in the load element group of the load adjustor section 1C (FIG. 4). Furthermore, selection transistors MS(0) through MS(n/2) are arranged between respective terminals of the resistances RB(1) through RB(n/2). Different from the second and third embodiments, gate terminals of respective selection transistors MS(0) through MS(n/2) are controlled by inversion signals of OR signals of column address pairs, namely, (Y(0) and Y(n)), (Y(1) and Y(n−1)), (Y(2) and Y(n−2)), (Y(n/2) and Y(n/2+1)). In this case, each of the selection transistors MS(0) through MS (n/2) becomes conductive to short-circuit resistances RB(1) through RB(n/2). Accordingly, in case the column address pairs (Y(0) and Y(n)), (Y(l) and Y(n−1)), (Y(2) and Y(n−2)), ... , (Y(n/2) and Y(n/2+1)) are selected, the resistances RB(1) through RB(n/2) are inserted in a current path.

Similar to the second and third embodiments, in the fourth embodiment, each connection point of the common line CL0 or CL1 is arranged with constant interval taken. Therefore, resistances R1 through Rn existing between adjoining connection points have a same resistance value and this embodiment is applicable to a case that resistances R0 and R(n+1) at both ends have a same resistance value.

Resistances RB(0) through RB(n/2) in the load element group are equivalent to resistances of the common line CL0 or CL1. That is, for example, a resistance RB(0) is selected for a column address Y(0) or Y(n) and it is expressed such that: RB(0)=R(Y0)= R0//(R1+ ... +R(n+1)). For a column address Y(1) or Y(n−1), resistances RB(1) is selected and it is expressed such that: RB(1)=R(Y1)=(R0+R1)//(R2+ ... +R(n+1)). For a column address Y(2) or Y(n−2), resistances RB(2) is selected and it is expressed such that: RB(2)=R(Y2)=(R0+R1+R2)//(R3+ ... +R(n+1)).

Figure 6:
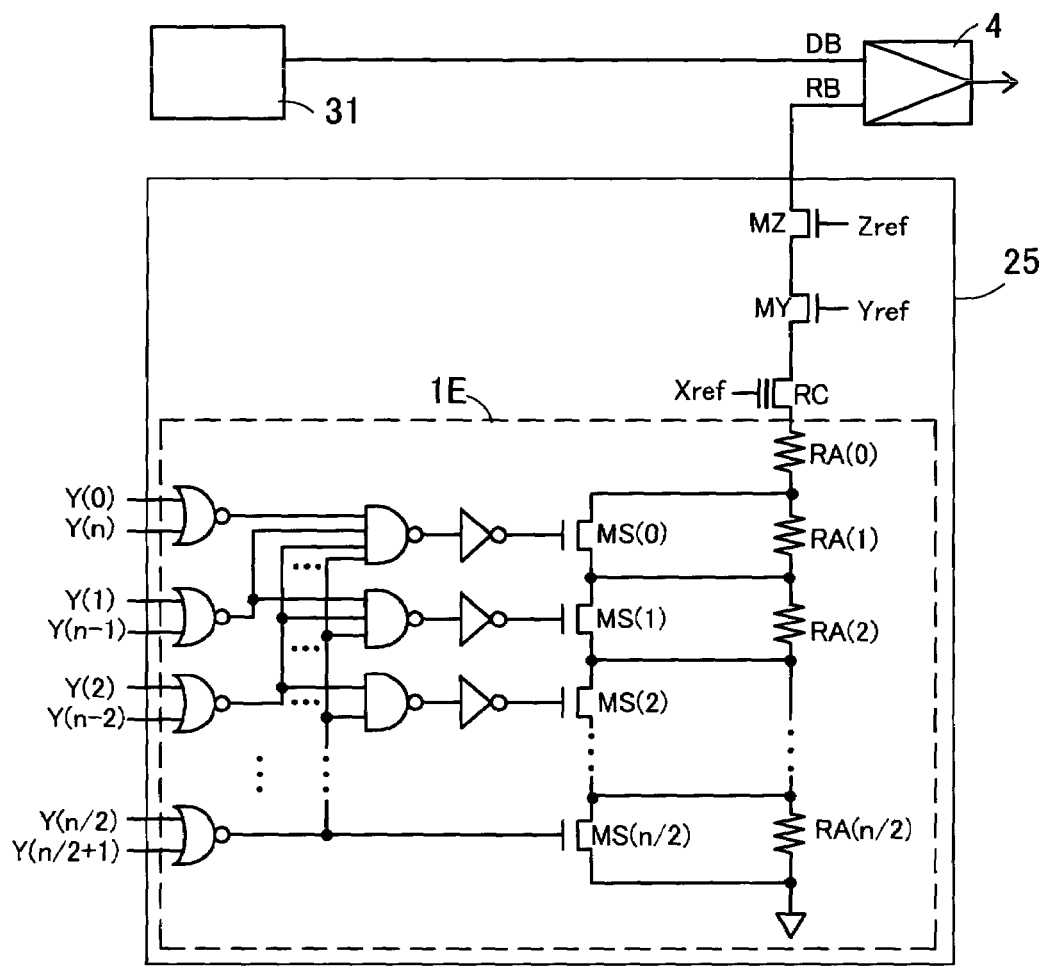
FIG. 6 is a circuit diagram of a fifth embodiment.

A fifth embodiment as shown in FIG. 6 has a reference section 25 including a load adjustor section 1E, instead of the reference section 23 of the third embodiment (FIG. 4).

The load adjustor section 1E includes selection transistors MS(0) through MS(n/2) between respective terminals of the resistances RA(1) through RA(n/2), instead of the selection transistors MS(0) through MS(n/2) in the load adjustor section 1C (FIG. 4). Gate terminal of respective selection transistors MS(0) through MS (n/2) are controlled such that, a gate terminal of a selection transistor MS(n/2) is controlled by a NOR signal of a column address pair (Y(n/2) and Y(n/2+1)), and subsequently controlled by signals equivalent to logical product among the NOR signal and NOR signals by adding thereto in order. In this case, each of the selection transistors MS(0) through MS (n/2) becomes conductive to short-circuit resistances RA(1) through RA(n/2). Accordingly, similar to the case of the third embodiment, the resistances RA(1) through RA(n/2) are added up and inserted in a current path depending on distance of connection point from the both ends in the common line CL0 or CL1.

Figure 8:
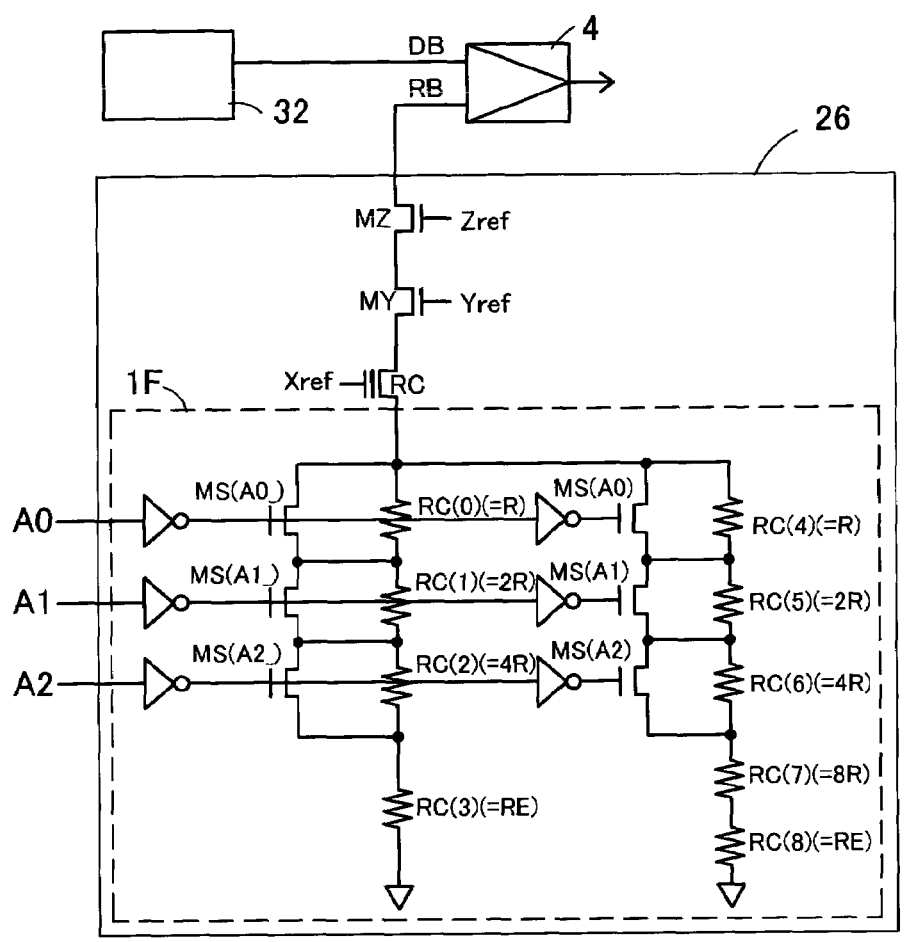
FIG. 8 is a circuit diagram of the sixth embodiment.

A sixth embodiment as shown in FIG. 8 has a reference section 26 including a load adjustor section 1F.

Figure 7:
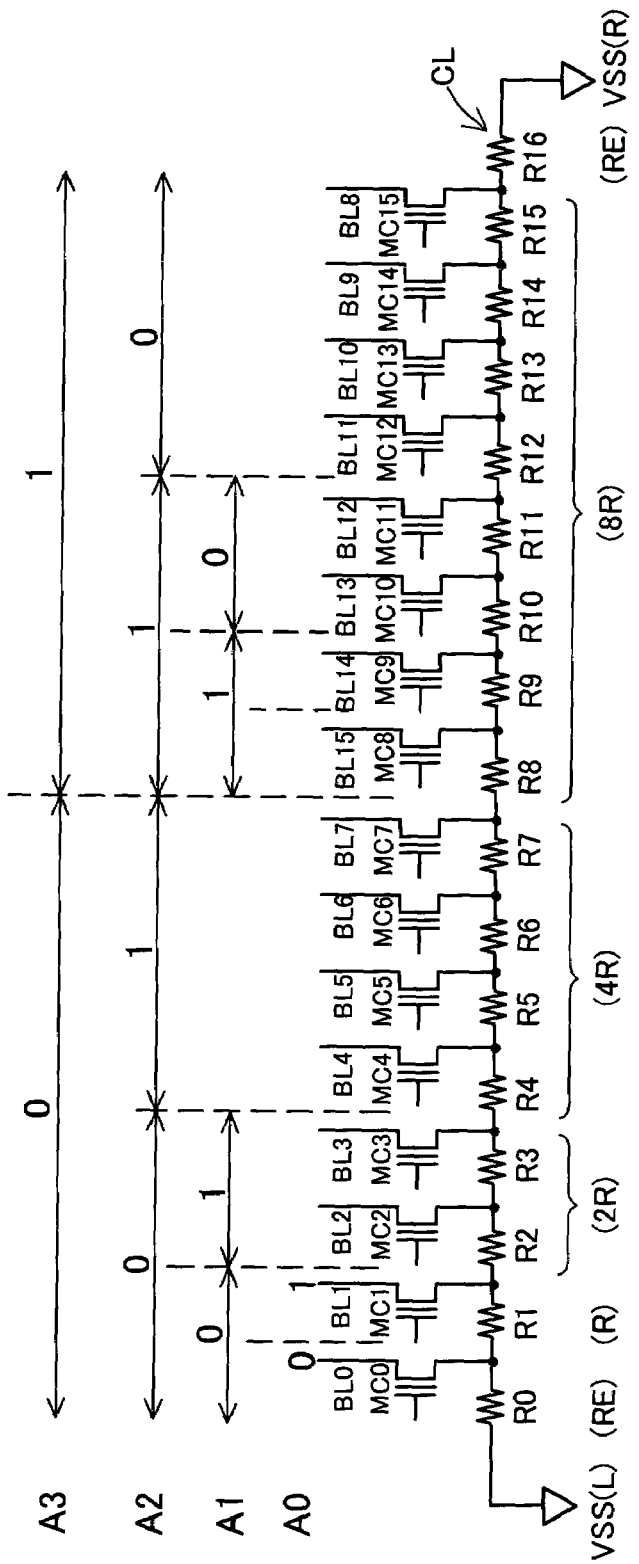
FIG. 7 is a schematic diagram for illustrating column-direction addressing in memory cell array of a sixth embodiment.

Prior to describing the sixth embodiment, a memory cell array 32 that applies structure of the load adjustor section 1F as shown in FIG. 7. In FIG. 7, sixteen sets of memory cells, namely, non-volatile transistors MC0 through MC15, are controlled by a row address X.

Source terminals of respective non-volatile transistors MC0 through MC15 are connected to connections points arranged on the common line CL with constant interval taken. Resistances R1 through R15 arranged between each of adjoining connection points have a same resistance value R. Furthermore, both a resistance R0 between VSS(L), one of the ends, and its adjoining connection point and resistance R16 between VSS(R) and its adjoining connection point have a same resistance value RE.

Drain terminals of the non-volatile transistors MC0 through MC15 are connected to bit lines BL0 through BL7 and BL15 through BL8, one by one. Numerals assigned to the non-volatile transistors MC0 through MC15 and numeral order of the bit lines to be connected do not coincide. Addressing of column addresses A0 through A3 that are to connect memory cells to bit lines are not arranged in simple numerical order, however, it has mirrored structure at an halfway point where a logic value of a column address A3 is switched between "0" and "1". It should be noted that column addresses A0 through A3 are before-decoded column addresses Y(0) through Y(n), respectively.

Next, details of the sixth embodiment shown in FIG. 8 will be described. The load adjustor section 1F has two resistance arrays, namely, a first load element group and a second load element group instead of load adjustor sections 1A through 1E of the first through fifth embodiments.

A first resistance array is constituted by resistances RC(0) through RC(3) arranged in series. The resistances RC(0) through RC(2) have resistance value obtained by multiplying a resistance value R by exponential multiplier of 2 and their resistance values are R, 2R, and 4R. A resistance RC(3) has a resistance value RE. Furthermore, selection transistors MS (A0_) through MS(A2_) are arranged between respective terminals of resistances RC(0) through RC(2). Gate terminals of respective selection transistors MS(A0_) through MS(A2_) are controlled by inversion signals of column address A(0) through A(2), respectively. Thereby, the selection transistors MS(A0_) through MS(A2_) controlled by selected column address A(0) through A(2), respectively, become non-conductive and the resistances RC(0) through RC(2) are inserted in a current path. As shown in FIG. 7, memory cells are selected in accordance with column addresses A(0) through A(2) and along with the selection, a current path is established. The first resistance array can set a resistance equivalent to a current path leading to the terminal VSS (L) from a connection point of a memory cell MC7 on the common line CL or wiring resistance on current path leading to the terminal VSS (R) from a connection point of a memory cell MC8.

A second resistance array is constituted by resistances RC(4) through RC(8) arranged in series. Resistances RC(4) through RC(6) are structured same as resistances RC(0) through RC(2) and a resistance RC(7) has a resistance value 8R multiplied by exponential multiplier of 2. A resistance RC(8) has a resistance value RE. Furthermore, selections transistors MS(A0) through MS(A2) are arranged in a same manner as the selection transistors MS(A0_) through MS(A2_). However, gate terminals of respective selection transistors MS(A0) through MS (A2) are controlled by in-phase signals of column addresses A(0) through A(2). Contrary to the case of the first resistance array, the selection transistors MS(A0) through MS(A2) controlled by selected column addresses A(0) through A(2) become conductive to short-circuit the resistance RC(4) through RC(6). In the second resistance array, there can be set a current path in an opposite direction of the first resistance array. That is, there can be set a current path leading to the terminal VSS (R) from a connection point of the memory cell MC7 on the common line CL or a resistance equivalent to wiring resistance on a current path leading to the terminal VSS (L) from a connection point of the memory cell MC8.

Accordingly, wiring resistances on two current path that lead to both ends of the common line CL from each connection point can be set by the first resistance array and the second resistance array. Since the resistance value R between connection points is set by exponential multiplier of 2 in the first resistance array and the second resistance array, wiring resistance to reference voltage VSS from each connection point on the common line CL can be set with a small number of resistances.

In case memory cells are connected to the common line CL with constant interval taken, the number of composing elements for a selector section and load element group in a reference section 26 can be reduced to fewer than the cases of the second through fifth embodiments. Thereby, the load adjustor section 1F can be structured with smaller-sized circuit design. That is, with small-sized circuit structure, there can be structured the reference cell section 26 capable of constantly securing sufficient margin of data readout without accounting on positioning strategy of memory cells.

According to the sixth embodiment, there can be further obtained effects as follows. The first resistance array (RC(0) through RC(3)) and the second resistance array (RC(4) through RC(8)) as the first and second element groups exclusively select each of resistances RC(0) through RC(2) and resistances RC(4) through RC(6) as the second load elements for each other. Thereby, there can be structured loads equivalent to loads on the common line CL forwarding to each of the ends VSS (L) and VSS (R) with reference to a connection point to the common line CL (FIG. 7) for a selected memory cell as boundary and can be connected to the reference cell RC. Since second load elements obtained by grouping with exponential multiplier of 2 are provided in the load element group, there can be provided a load adjustor section IF that has impedance equivalent to impedance by resistances R1 through R15, as the first load elements of the common line CL, at each connection point on the common line CL with small number of load elements RC(0) through RC(3) and RC(4) through RC(8) and small number of selection transistors MS (A0_) through MS(A2_) and MS(A0) through MS(A2).

Figure 9:
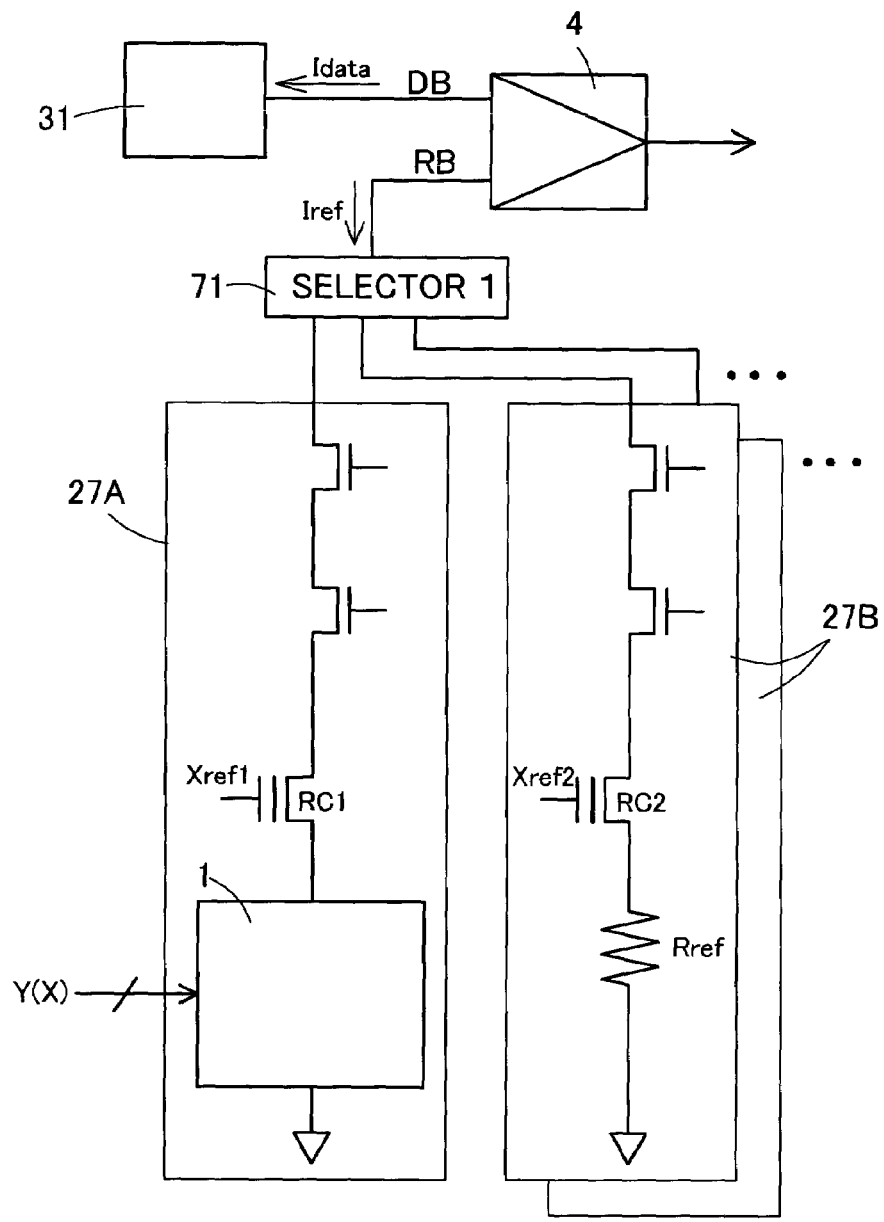
FIG. 9 is a circuit diagram of a seventh embodiment.

A seventh embodiment as shown in FIG. 9 is a case that a reference section 27A including a load adjustor section 1 and a plurality of reference sections 27B including fixed load resistance Rref are provided on condition that a plurality of readout operation modes are equipped. Each of the reference section 27A and the reference sections 27B is selected by a selector 1 (71) in accordance with readout operation mode and then, connected to a reference line RB. It should be noted that reference cells RC1 and RC2 arranged in the respective reference sections 27A and 27B are equivalent with memory cell.

A non-volatile semiconductor memory device may be equipped with readout operation mode for program verification (PGMV mode) that is to verify whether or not data are correctly programmed on non-volatile transistors, and readout operation mode for erase verification (ERV mode) that is to verify whether or not data on non-volatile transistors are correctly erased, other than normal readout operation (READ mode). Since PGMV mode and ERV mode are operation for changing threshold voltage of non-volatile transistors, there may be voltage-current characteristic difference between operation modes even though same level of gate voltage is applied. Accordingly, it is necessary to arrange a reference cell not for READ mode and voltage-current characteristic different by operation mode need to be set.

Figure 10:
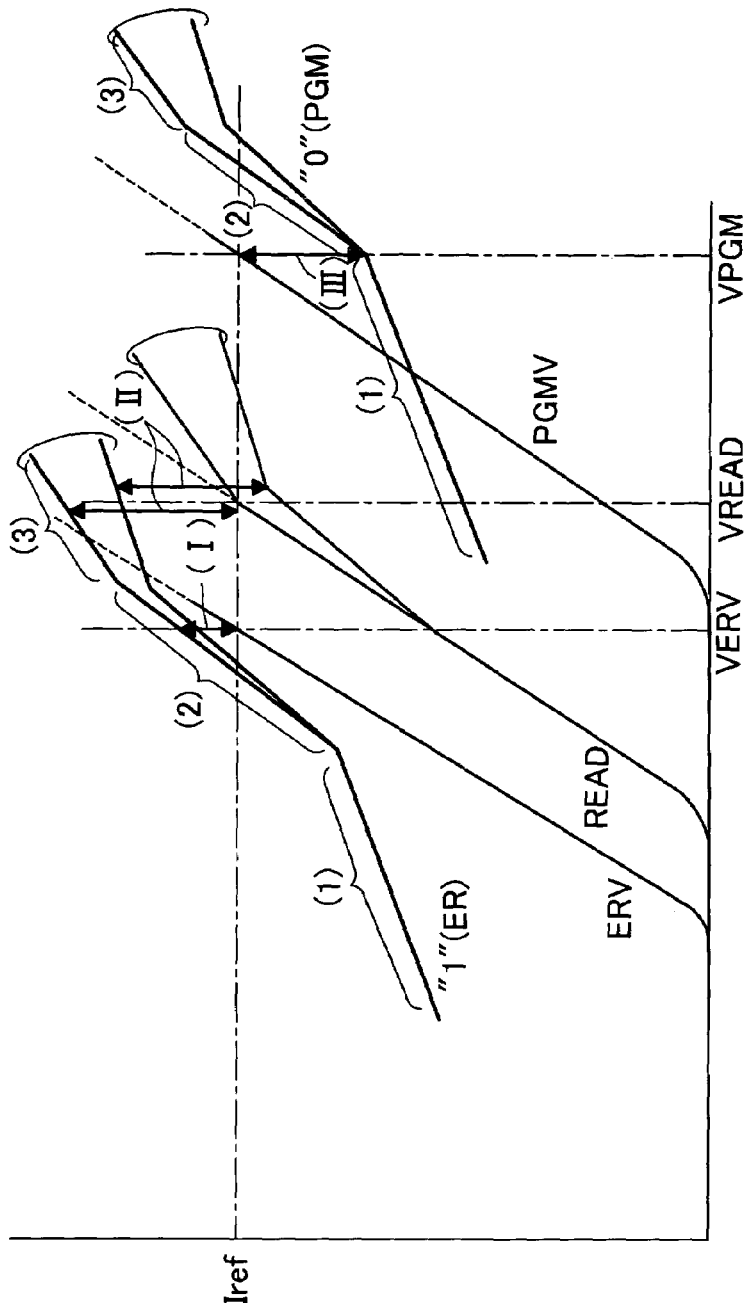
FIG. 10 shows transistor characteristic of the seventh embodiment.

As shown in FIG. 10, in case of ERV mode where carriers are ejected out from floating gates of non-volatile transistors, it shows a voltage-current characteristic of shallow threshold voltage (ERV curve in FIG. 10). On the other hand, in case of PGMV mode where carriers are injected in floating gates, it shows a voltage-current characteristic of deep threshold voltage (PGMV curve in FIG. 10). In case of READ mode, it shows an intermediate characteristic of those two characteristics (READ curve in FIG. 10). Under situation that "1" derived from erase operation is written on, a voltage-current characteristic of a memory cell draws a curve of threshold voltage shallower than ERV curve. Under situation that "0" derived from program operation is written on, a voltage-current characteristic of a memory cell draws a curve of threshold voltage deeper than PGMV curve. Voltage-current characteristic of a memory cell can be classified into three regions: a small current region ((1) in FIG. 10) where leak current at a bit line cannot be neglected; a large current region ((3) in FIG. 10) where influence of source resistance cannot be neglected; and an intermediate current region ((2) in FIG. 10), an intermediate region of the above two regions. In the small current region ((1) in FIG. 10), a tilt of voltage-current characteristic is gentle and source resistance does not affect characteristics. In the large current region ((2) in FIG. 10), influence of source resistance cannot be denied but it is a trifle degree. In the intermediate current region ((3) in FIG. 10), influence of source resistance is great and difference of current values under same voltage bias becomes large depending on difference of source resistance.

In ERV mode, a curve is compared with ERV curve at the region (2) of a memory cell. Accordingly, variation of data current Idata due to source resistance is a little and source resistance differs by selected memory cell, a current difference of data current Idata and reference current Iref ((I) in FIG. 10) is a little. Therefore, the reference section 27B is used for ERV operation with equivalent margin of readout.

On the other hand, in READ mode, a curve is compared with READ curve at the region (3) of a memory cell. In the region (3), variation of data current Idata due to source resistance is large. In this case, there is used the reference section 27A including the load adjustor section 1 capable of adjusting source resistance of a reference cell RC1 in accordance with column address Y(X) so as to make current difference of data current Idata and reference current Iref ((II) in FIG. 10) equivalent to each other regardless of any memory cells. Thereby, even if source resistance differs by selected memory cell, READ operation can be executed with constantly equivalent margin of readout.

In case curves are compared at the region (1) of a memory cell under PGMV mode, characteristic variation due to difference of source resistance of a memory cell can be neglected. Therefore, even if source resistance differs by selected memory cell, current difference of data current Idata and reference current Iref ((III) in FIG. 10) can be neglected. Therefore, the reference section 27B is used for PGMV operation with equivalent margin of readout.

In case curves are compared at the region (3) over the region (1) and further over the region (2), variation of data current Idata due to source resistance becomes large. However, modulation of voltage-current characteristics due to influence of source resistance in a direction for restricting current and current difference of data current Idata and reference current Iref ((III) in FIG. 10) becomes large. Accordingly, the reference section 27B is also used for ERV operation with equivalent margin of readout.

Figure 11:
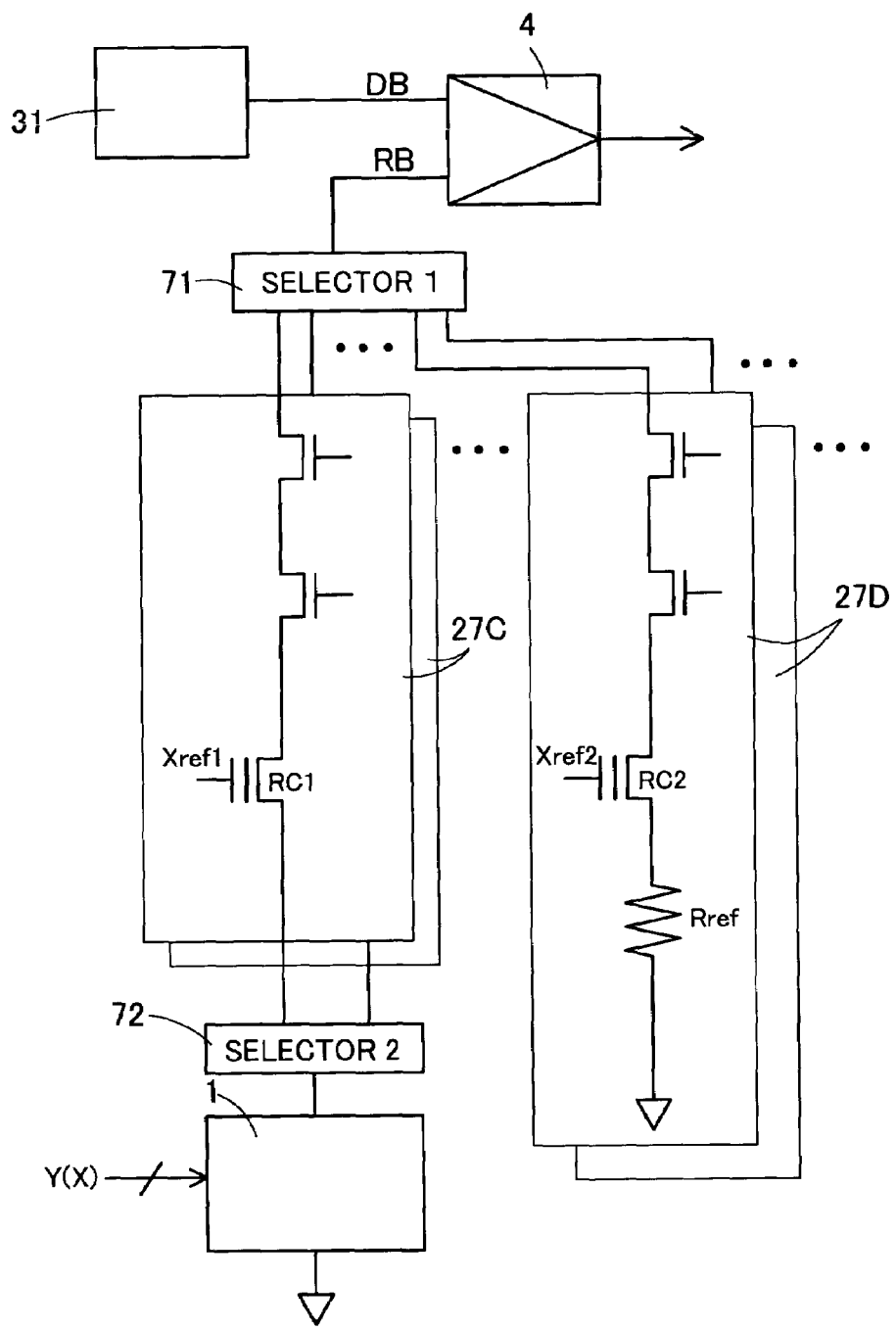
FIG. 11 is a circuit block diagram of a first variant directed to the seventh embodiment.

A first variant directed to the seventh embodiment as shown in FIG. 11 is a case that a plurality of reference sections 27C reference current Iref at which is adjusted by a load adjustor section 1 on condition that a plurality of readout operation modes are equipped. Instead of the reference section 27A, a plurality of the reference cell sections 27C share the load adjustor section 1 using a selector 2(72). Similar to the selector 1(71), the selector 2(72) selects an appropriate reference section 27C in accordance with type of readout operation mode.

Reverting to FIG. 10, in case curves are compared at the region (3) under PGMV mode, there may be used a reference section 27C provided with a load adjustor section 1 capable of adjusting source resistance of a reference cell RC1 in accordance with column address Y(X) even though it is PGMV mode so that current difference of data current Idata and reference current Iref should be made equivalent regardless of any memory cells. Since READ mode and PGMV mode never operate concurrently, the load adjustor section 1 can be shared by those two operation modes.

Figure 12:
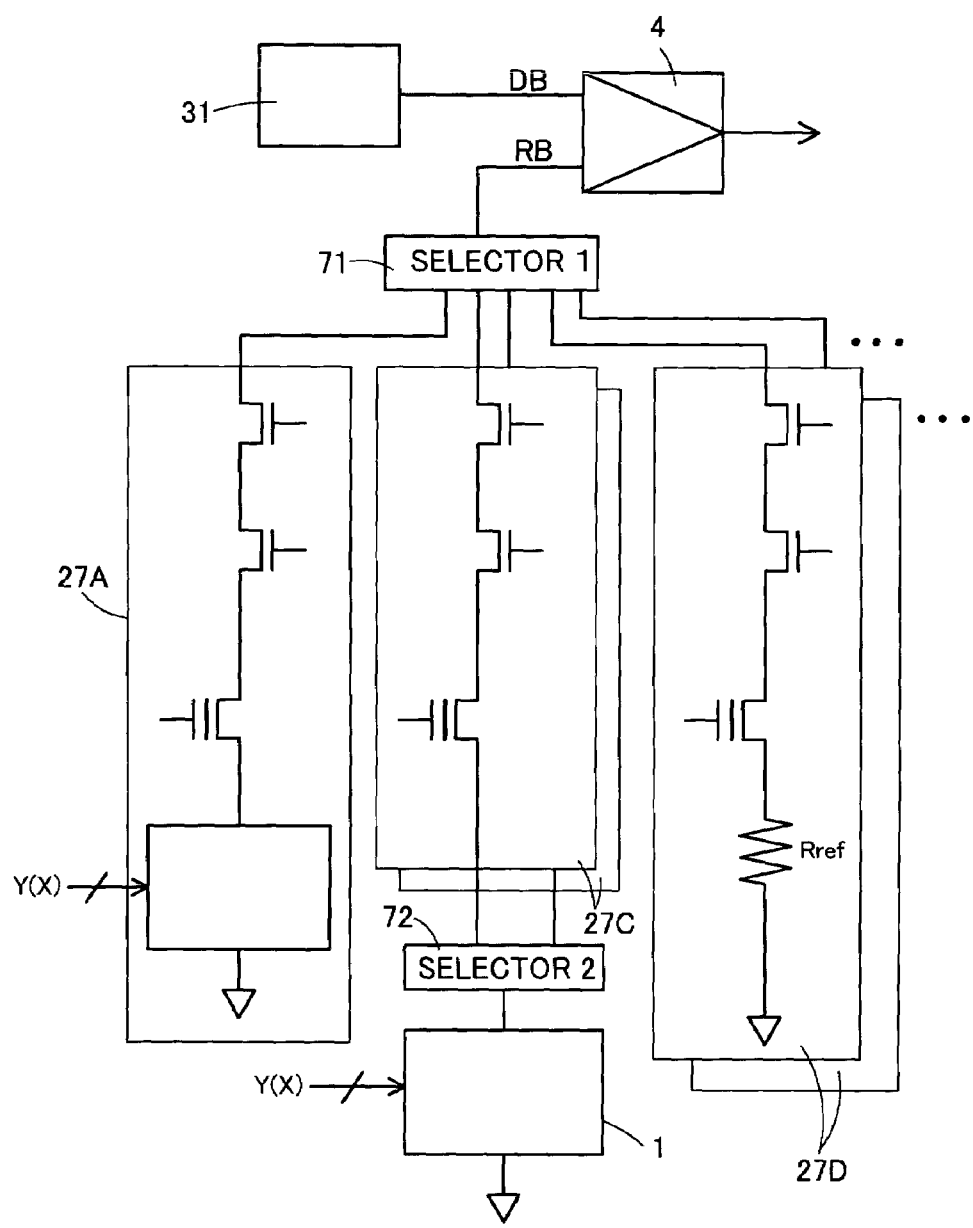
FIG. 12 is a circuit block diagram of a second variant directed to the seventh embodiment.

A second variant directed to the seventh embodiment as shown in FIG. 12 includes a reference section 27A in addition to the structure of the first variant. The reference section 27A is used for READ mode and the reference cell sections 27C are used for PGM mode or ER mode. In case a plurality of banks are provided, READ mode and PGM or ER mode can possibly be executed between banks concurrently. The reference section 27A is used for READ mode and as for PGM or ER mode, reference sections 27C are switched therebetween by the selector 2(72) to connect the load adjustor section 1 to a reference section 27C appropriate for target operation mode. Level of reference current Iref thus can be adjusted appropriately depending on various operation modes.

According to the seventh embodiment, there can be obtained further effects as follows. Specifically, for readout operation mode readout characteristic of which is affected when second loads different by each memory cell are connected, there can be provided the reference section 27A capable of adjusting first load to be connected to a reference cell RC1 in accordance with column address Y(X) (see FIG. 9). Thereby, there can be obtained readout characteristic with sufficient margin for all of the readout operation. Furthermore, in case reference sections 27C are provided for each of two or more readout operation modes, the load adjustor section 27C can be shared by the reference sections 27C because each of the reference sections 27C does not operate concurrently. Therefore, circuit scale for reference sections can be compressed.

In a non-volatile semiconductor memory device, in case memory cells and reference cells include non-volatile transistors, second load different by each memory cell should be connected to a source terminal of a non-volatile transistor as source resistance. That is, as source current flowing in a source resistance becomes large, voltage drop becomes larger in response to the source resistance and consequently, bias voltage of the non-volatile transistor fluctuates and along with that, voltage-current characteristic of the transistor fluctuates. Accordingly, in case of READ mode, or READ mode and PGMV mode where readout operation is possibly executed in relatively large current region, there can be adjusted a first load to be connected to a reference cell and voltage-current characteristic of a transistor for a memory cell and a transistor for a reference cell can be made equivalent at a large current region.

Furthermore, in case threshold voltage to be compared with a memory cell is in large current region ((3) in FIG. 10) where a source resistance gives some influence on voltage-current characteristic of a memory cell under ERV mode, it is effective to connect the load adjustor section 1 to a source terminal of a reference cell under READ mode as well as to a source terminal of a reference cell under ERV mode. Thereby, under ERV mode, current difference of data current Idata and reference current Iref can be made equivalent regardless of any memory cells.

The load adjustor section 1 may be provided for reference sections for supplying reference current Iref for an operation mode affected by difference of wiring load connected to a memory cell. Furthermore, the load adjustor section 1 can be shared among reference cell sections. Thereby, load to be connected to a reference cell in accordance with selected memory cell can be adjusted with small-scaled circuit structure.

FIG. 13 through FIG. 17 are directed to an eighth embodiment that intends to symmetrical load structure of current paths for data current Idata and reference current Iref both of which are connected to a differential amplifier 4.

Figure 13:
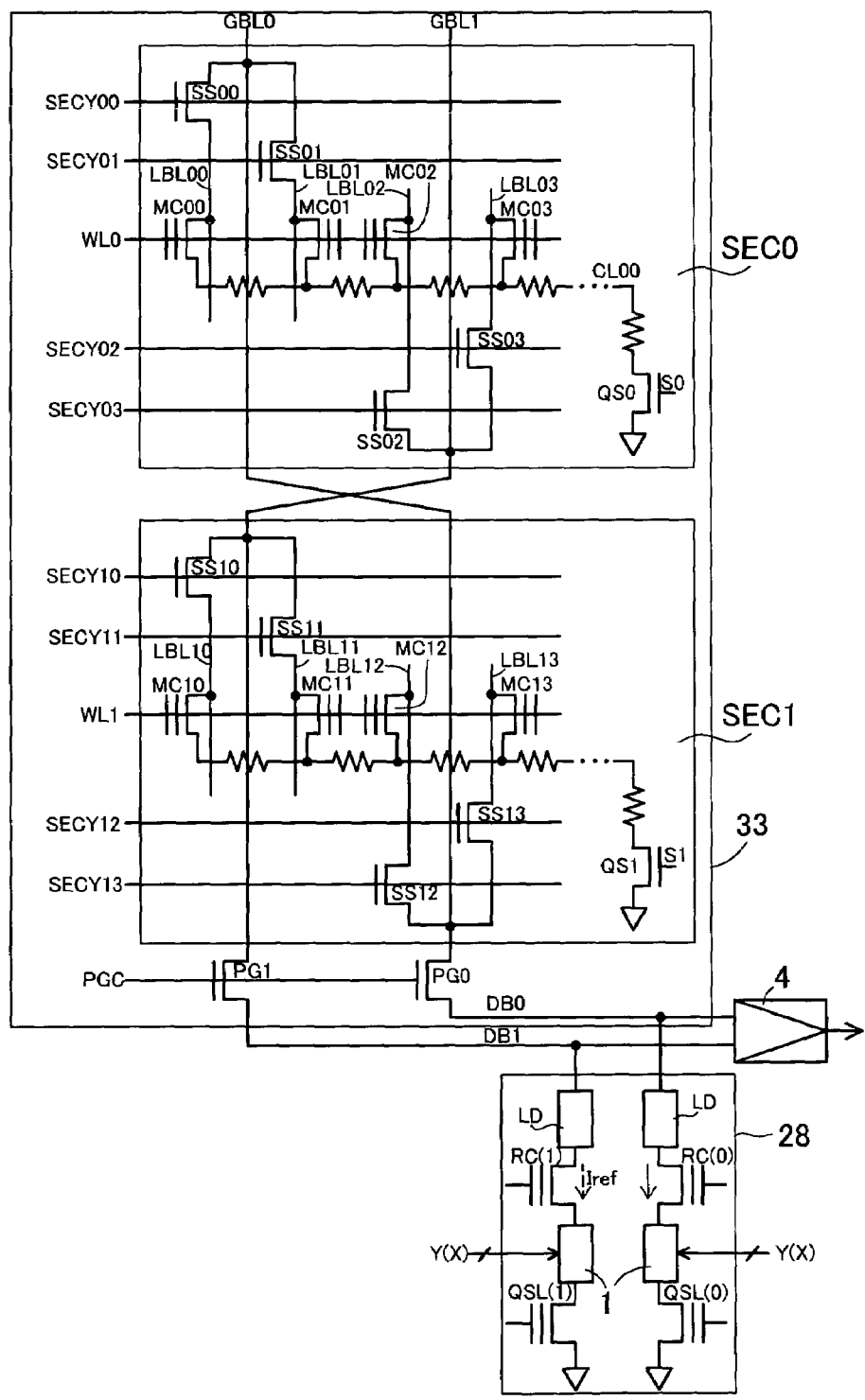
FIG. 13 is a circuit block diagram of an eighth embodiment.

FIG. 13 shows an circuit block diagram. A memory cell array 33 is constituted by two sectors SEC0 and SEC1. When a sector SEC0 is selected, a control signal S0 is activated and a switch transistor QS0 becomes conductive. Furthermore, memory cells MC00 through MC03 selected by a word line WL0 connect each of local bit lines LBL00 through LBL03 and a common line CL00. Still further, the common line CL00 is connected to reference voltage VSS through a switch transistor QS0, whereby a data path is formed. The local bit lines LBL00 through LBL03 are connected to a global bit lines GBL0 or GBL1 through selector switches SS00 through SS03 selected by control signals SECY00 through SECY03.

Along with selection of a local bit line by selector switches SS00 through SS03, control signals SECY10 through SECY13 are activated simultaneously. Local bit lines LBL10 through LBL13 in a non-selected sector SEC1 located on corresponding positions in adjoining sector SEC0 are connected to a global bit lines GBL1 or GBL0. Local bit lines in the non-selected sector SEC1 are connected memory cells as many as local bit lines in the selected sector SEC0. Since positioning of them in the sector SEC1 is equivalent to that of them in the sector SEC0, physical parameters against theirs environment in SEC1 are equivalent to SEC0. Therefore, loads at SEC0 and SEC1 are equivalent to each other. Furthermore, since the global bit lines to which local bit lines of both sectors SEC0 and SEC1 are connected are arranged adjoining to each other, physical parameters against environment therearound are equivalent to each other.

Data bus lines DB0 and DB1 are connected to a loader section 28 for supplying reference current Iref to a data line to which a selected memory cell is not connected. The data bus lines DB0 and DB1 are further connected to the global bit lines GBL0 and GBL1, respectively, through path transistors PG0 and PG1 both of which are controlled by a path control signal PGC. The loader section 28 includes loads LD, reference cells RC(0), RC(1), and switch transistors QSL(0), QSL(1) for each of the data bus lines DB0 and DB1. Furthermore, there are arranged load adjustor sections 1 for arranging load in accordance with column address Y(x) between the reference cell RC(0) and the switch transistor QSL(0), and between RC(1) and QSL(1).

It should be noted that the loads LD are equivalent to loads on paths that lead to the data bus lines DB0, DB1 from the local bit lines and the global bit lines through path transistors in the memory cell array 33. Furthermore, load adjusted by the load adjustor section 1 is equivalent to wiring load for the common line to which a source terminal of a selected memory cell is connected. The load adjustor section 1 connects equivalent load to a source terminal of a reference cell depending on a column address Y(X) that designates a position of a memory cell to be selected.

Figure 14:
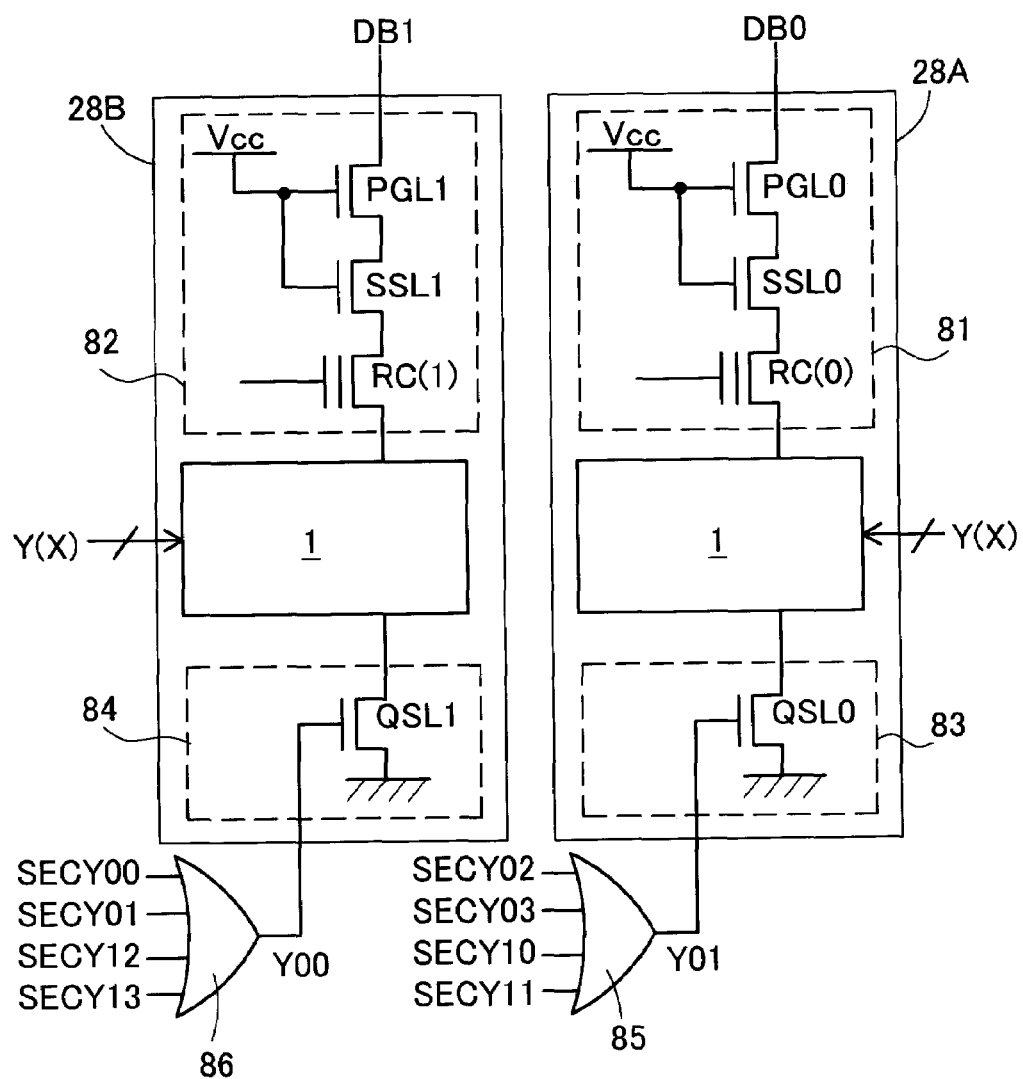
FIG. 14 is a specific example of the eighth embodiment.

FIG. 14 shows a specific example of loader sections 28A and 28B. Two loader sections equivalent to each other are connected to each of data bus lines DB0, DB1. Each of the loader sections includes reference loader sections 81, 82 and selection switch sections 83, 84 respectively including switch transistors QSL0, QSL1.

The reference loader section 81, 82 are constituted by reference cells RC(0), RC(1), and pairs of transistors (PGL0, SSL0), (PGL1, SSL1), as loads LD, respectively. It should be noted that the transistors SSL0 and SSL1 are equivalent to sector switches (SS00 through SS13 in FIG. 13) for connecting the local bit lines and global bit lines. The transistors PGL0, PGL1 are equivalent to path transistors PG0, PG1. Power source voltage VCC is applied to gate terminals of those transistors to constitute loads LD equivalent to transistors existing on paths leading to data bus lines DB0, DB1 from local bit lines. Gate terminals of the reference cells RC(0), RC(1) may be controlled by reference selection signals Y01, Y00 for controlling to open/close switch transistors QSL0, QSL1 or by signals in-phase to those reference selection signals Y01, Y00. Alternatively, power source voltage VCC is applied to gate terminals of those transistors so as to make them constantly conductive.

It should be noted that the reference selection signals Y01, Y00 are signals for supplying reference current Iref to global bit lines GBL1, GBL0 complimentary to global bit lines GBL0, GBL1, respectively, on which a data path for a selected memory cell. As a logical OR output of control signal SECY00, SECY01, SECY12, and SECY13 transmitted through the global bit line GBL0 as data path, a reference signal Y00 is selected from an OR gate 86 to supply reference current Iref to the global bit line GBL1. Furthermore, As logical OR output of control signals SECY02, SECY03, SECY10, and SECY11 transmitted through the global bit line GBL1 as data path, a reference signal Y01 is selected from an OR gate 85 to supply reference current Iref to the global bit line GBL0.

Figure 15:
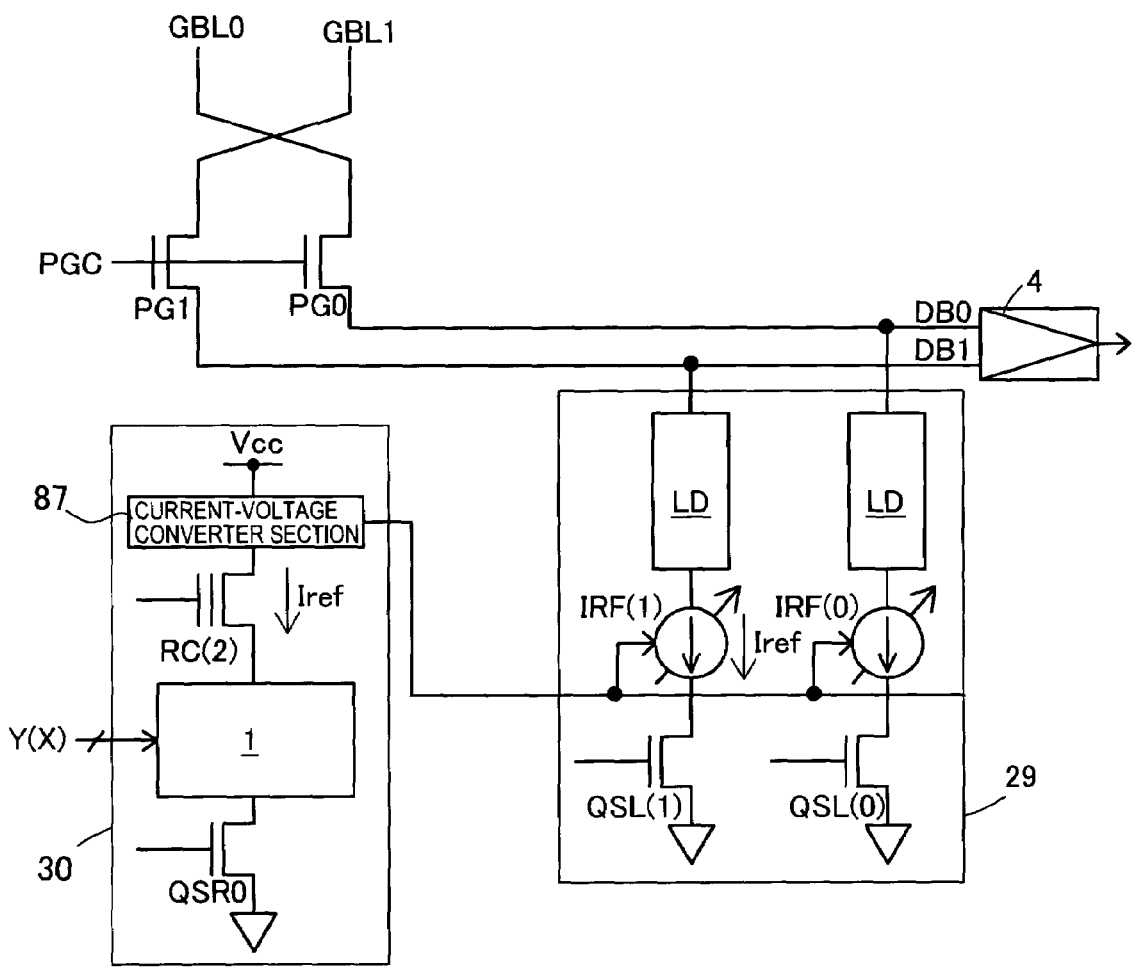
FIG. 15 is a circuit block diagram of a variant directed to the eighth embodiment.

FIG. 15 shows a variant directed to the eighth embodiment. The variant is structured with a loader section 29, instead of the loader section 28, and a regulator section 30 for regulating the loader section 29.

The loader section 29 includes loads LD, switch transistors QSL(0) QSL(1), similar to the loader section 28, and voltage control current source IRF(0), IRF(1), instead of reference cells RC(0), RC(1). Furthermore, the regulator section 30 includes a reference cell RC(2), a switch transistor QSR0 for generating reference current Iref and a current-voltage converter section 87 for converting reference current Iref into a voltage value. There is arranged a load adjustor section 1 for adjusting load in accordance with column address Y(X) between the reference cell RC(2) and the switch transistor QSR0. Regulate voltage responsive to reference current Iref outputted from the current-voltage converter section 87 controls voltage control current source IRF(0), IRF(1), whereby current corresponding to reference current Iref is outputted from the loader section 29. Similar to case of the loader section 28 (FIG. 13), one of the switch transistors QSL(0), QSL(1) is selected. On the other hand, the reference cell RC(2) and the switch transistor QSR0 are constantly selected for readout operation to constantly generate reference current Iref.

Figure 16:
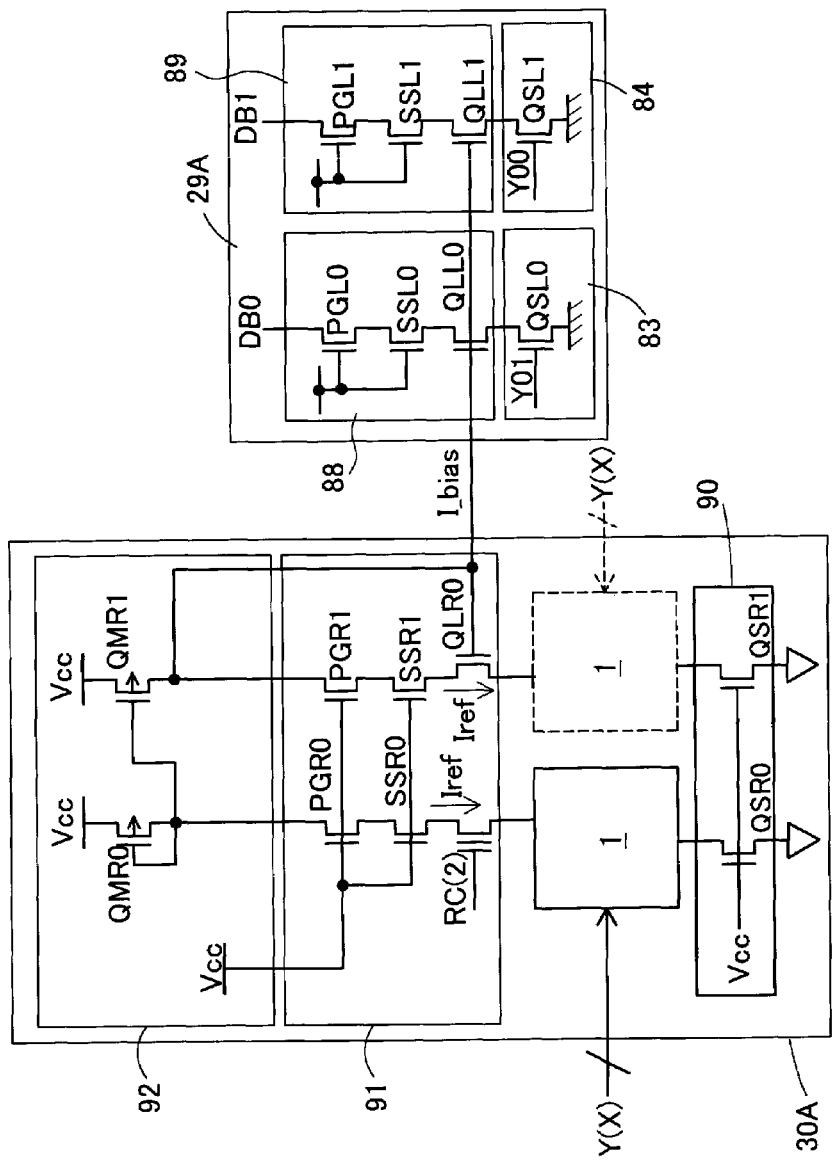
FIG. 16 is a circuit block diagram of a first specific example of the variant directed to the eighth embodiment.

FIG. 16 shows a first specific example of a variant directed to the eighth embodiment. Similar to the loader sections 28A, and 28B in FIG. 14, a loader section 29A includes reference loader sections 88, 89 and selection switch sections 83, 84 including switch transistors QSL0, QSL1, respectively. Different from the reference loader sections 81, 82, the reference loader sections 88, 89 include load transistors QLL0, QLL1 controlled by regulate voltage I_bias, instead of reference cells RC(0), RC(1). It should be noted that the load transistors QLL0, QLL1 have structure equivalent to a load transistor QLR0 in a regulator section 30A that will be described in the next paragraph.

There are provided a selection switch section 90, a reference loader section 91 and a bias section 92 in the regulator section 30A including a reference cell RC(2). Furthermore, the regulator section 30A is constituted by a reference current generator section (on left side of the regulator section 30A in FIG. 16) for generating reference current Iref, and a regulate voltage generator section (on right side of the regulator section 30A in FIG. 16) for converting reference current Iref into regulate voltage I_bias.

There is arranged a load adjustor section 1 for adjusting load in accordance with column address Y(X) between the selection switch section 90 and the reference load section 91. The load adjustor section 1 has a function to connect load in proportion to wiring load to be connected to a memory cell to be selected by column address Y(X) to the reference cell RC(2). Load to be adjusted herein is load connected to a source terminal of a reference cell RC(2) to depending on load to be connected to a source terminal of a memory cell and the load adjustor section 1 may be arranged in a reference cell. Furthermore, a load transistor QLR0 may be included in the reference cell so as to secure current mirror characteristic of reference current Iref in the regulator section 30A.

Structure of the selection switch section 90 and the reference loader section 91 is basically same as that of the selection switch section 83, 84 and reference loader sections 81, 82 for the loader sections 28A and 28B. However, there are two different points: (1) gate terminals of the switch transistors QSR0, QSR1 for the selection switch section 90 are connected to power source voltage VCC; and (2) instead of a reference cell, a load transistor QLR0 is inserted in the regulate voltage generator section for the reference loader section 91. Power source voltage VCC is applied to the switch transistors QSR0, QSR1 so as to constantly activate the regulator section 30A during readout operation. The load transistor QLR0 replaces a reference cell so as to generate regulate voltage I_bias. The bias section 92 includes a current mirror section (transistors QMR0, QMR1) for mirroring reference current Iref generated in the reference current generator section on the regulate voltage generator section.

A gate terminal of the load transistor QLR0 and a drain terminal of the current mirror section QMR1 are connected to each other so as to generate regulate voltage I_bias depending on mirrored reference current Iref in the regulate voltage generator section in the regulator section 30A. In case the transistor QMR1 constituting the current mirror section operates in saturation state, the transistor QMR1 in the current mirror section operates in high-output impedance state. Since current is kept to level almost same as reference current Iref without depending on drain voltage, regulate voltage I_bias is controlled so that the current Iref should flow in the load transistor QLR0. The regulate voltage I_bias is inputted to gate terminals of the load transistors QLL0, QLL1 in the loader section 29A.

Figure 17:
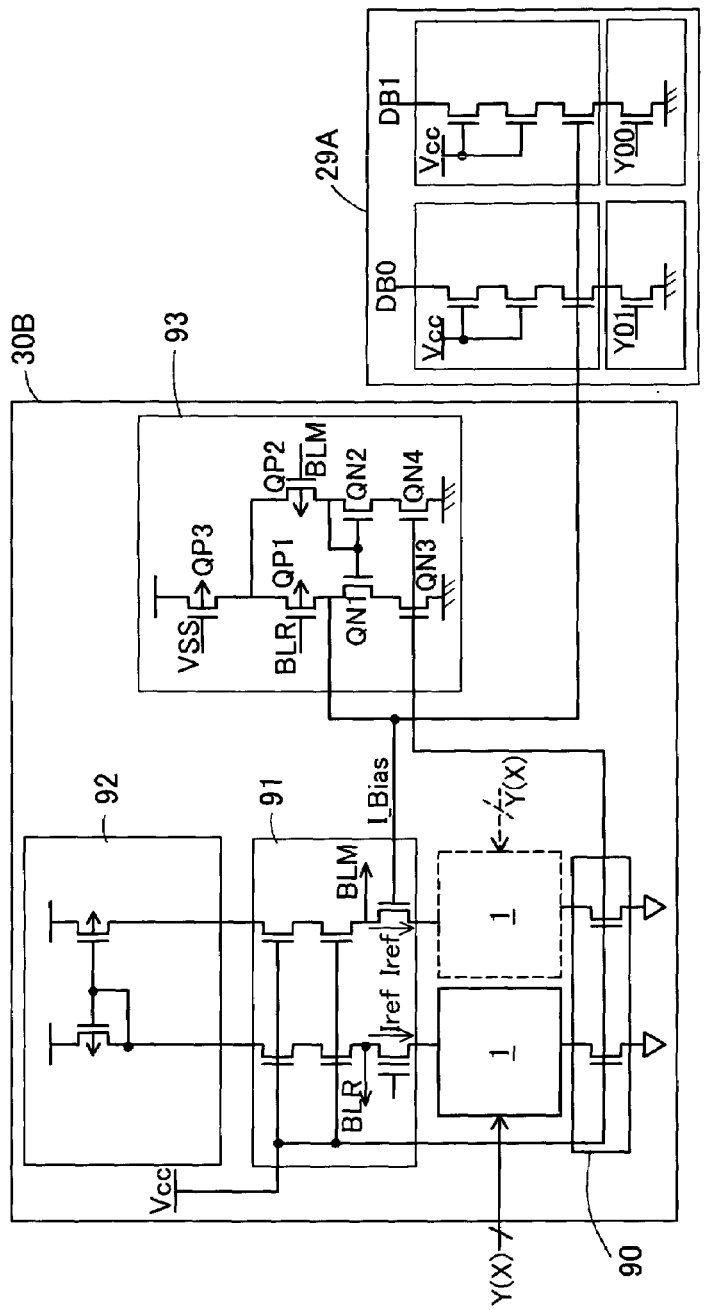
FIG. 17 is a circuit block diagram of a second specific example of the variant directed to the eighth embodiment.
Figure 18:
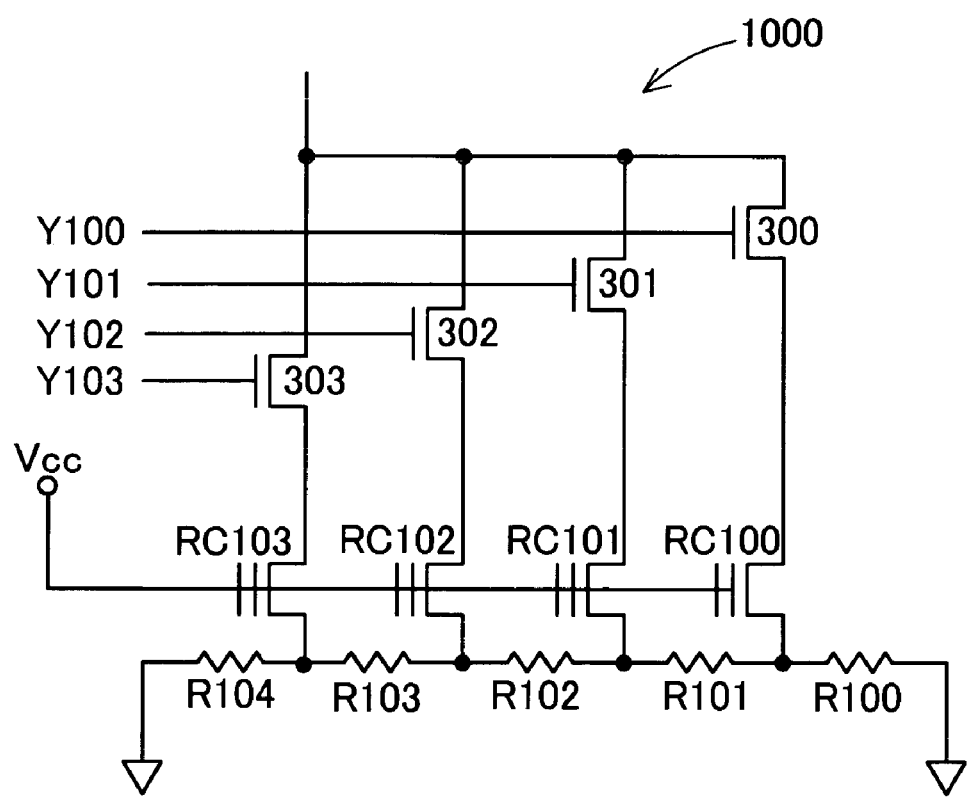
FIG. 18 is a circuit diagram of a conventional reference section.

FIG. 17 shows a second specific example of a variant directed to the eighth embodiment. Since basic structure of the second specific example is same as the first specific example in FIG. 16, description of it is omitted herein. In the second specific example, a regulator section 30B includes an operation amplifier section 93 so as to generate regulate voltage I_bias. The operation amplifier section 93 is constituted by input-difference paired transistors QP1, QP2 and active load transistors QN1, QN2. When switch transistors QN3, QN4 activate the operation amplifier section 93, bias current from a current source transistor QP3 flows therein and operation amplification is conducted. Drain potential of a memory cell and the loader transistor in the reference loader section 91 are inputted to the input-difference paired transistors QP1, QP2, and regulate voltage I_bias is controlled to make the two drain potential equivalent to each other.

As described, according to the eighth embodiment as shown in FIG. 13 and FIG. 14, the loader sections 28A or 28B in FIG. 14 as first loader section has the reference loader section 81 or 82 in FIG. 14 including a reference cell RC(0), RC(1), respectively, for supplying reference current Iref. As load, a local bit line, and a global bit line GBL0 or GBL1 as first digit line in FIG. 13, a data bath line DB0 or DB1 in FIG. 13 as first data line, and the loader section 28A or 28B itself are connected on the current path. Furthermore, as load on a data path, a local bit line, and a global bit line GBL1 or GBL0 as second digit line in FIG. 13, a data bus line DB1 or DB0 in FIG. 13 as second data line and the loader section 28B or 28A itself are connected on the data path starting from a selected memory cell. Loads on the both paths are made equivalent to each other so as to meet balance of loads on the both paths.

Furthermore, local bit line different by each memory cell in accordance with column address Y(X) as second digit line is connected on the paths. That is, second load equivalent to wiring resistance on the common line CL00 is connected thereto. The second load is balanced by first load adjusted in accordance with column address Y(X) at the load adjustor section 1 arranged in the loader section 28A or 28B. The loader section 28A or 28B is connected to the first digit line to which non-selected memory cells are connected. As to the second load to be connected to the second digit line for selecting a memory cell, fist load responsive to second load for each memory cell is connected to the loader section 28A or 28B in accordance with column address Y(X) for selecting a memory cell. Regardless of any selected memory cells, load on a path can be made idealistically equivalent at its memory cell side and reference cell side. Thereby, reference current Iref can be appropriately supplied during data is read out with data bus lines DB0 and DB1 being paired.

According to the variants directed to the eighth embodiment as shown in FIG. 15 through FIG. 17, the loader sections 29 in FIG. 15 and 29A in FIG. 16 and FIG. 17 as first loader section have the reference loader sections 88 and 89 in FIG. 16 including load transistors QLL0, QLL1 for supplying reference current Iref. As load, a local bit line, and a global bit line GBL0 or GBL1 as first digit line in FIG. 15, a data bus line DB0 or DB1 in FIG. 15 as first data line, and the loader section 29 or 29A itself are connected on the current path. Furthermore, as load on a data path, a local bit line, and a global bit line GBL1 or GBL0 as second digit line in FIG. 15, a data bus line DB1 or DB0 in FIG. 15 as second data line and the loader section 29 or 29A itself are connected on the data path starting from a selected memory cell. Loads on the both paths are made equivalent to each other so as to meet balance of loads on the both paths.

Furthermore, local bit line different by each memory cell in accordance with column address Y(X) as second digit line is connected on the paths. That is, second load equivalent to wiring resistance on the common line CL00 is connected thereto. The second load is balanced by first load adjusted in accordance with column address Y(X) at the load adjustor section 1 arranged in the regulator section 30 in FIG. 15, 30A in FIG. 16, and 30B in FIG. 17. The regulator section 30, 30A, 30B is connected to the first digit line to which non-selected memory cells are connected. As to the second load to be connected to the second digit line for selecting a memory cell, fist load responsive to second load for each memory cell is connected to the regulator section 30, 30A, 30B in accordance with column address Y(X) for selecting a memory cell. Regardless of any selected memory cells, load on a path can be made idealistically equivalent at its memory cell side and reference cell side. Thereby, reference current Iref can be appropriately supplied during data is read out with data bus lines DB0 and DB1 being paired.

Furthermore, it is not necessary to arrange a load adjustor section 1 for each of the loader sections 29, 29A. A load adjustor section 1 may be provided for the regulator sections 30, 30A and 30B. Even if a multi-bit output structured semiconductor memory device requires a plurality number of data bus line pairs and loader sections 29 and 29A are connected to each of the pairs, there may be arranged just one load adjustor section 1 and one reference cell. That is, there is no necessity of adjustment of characteristic variation among cells, which is required in case a plurality of reference cells are provided. This is a preferable aspect of the present invention.

Furthermore, there can be obtained other effects of the eighth embodiment as follows. That is, a pair of global bit lines GBL0 and GBL1 may be arranged with being adjacent to each other so that noises applied to one of the global bit lines are propagate to the another one, whereby noises become equivalent between the adjacent global bit lines. Loads between data bus lines DB0 and DB1 are balanced as well as propagation or decay of noises between the data bus lines during readout operation becomes equivalent, whereby influence of noises can be cancelled therebetween.

Furthermore, as another effect of that, there surely can be executed readout operation with data bus lines DB0, DB1, as a pair, regardless of variations due to manufacturing process and variations in chip or wafer.

Furthermore, the reference cells RC(0), RC(1) in FIG. 13, and RC(2) in FIG. 15 can be arranged on a region different from the case of the memory cell array 33. Thereby, voltage stress applied to memory cells during programming or the like is not applied to the reference cells RC(0), RC(1), and RC(2) and characteristics of those reference cells do not fluctuate. Accordingly, stable reference current Iref can be kept.

The present invention is not limited to the embodiments described above and may of course be improved or modified in various manners within the scope and spirit of the present invention.

For example, although there have been described examples of inventive non-volatile semiconductor memory devices in the embodiments, the present invention is not limited to those embodiments. Specifically, the present invention is similarly applicable to a semiconductor memory device that compares data current flowing through memory cells during data readout operation with reference current flowing through reference cell to differentially amplify the current difference as well as to a semiconductor memory device that compares voltage generated in responsive to current with reference voltage to differentially amplify the voltage difference.

Although load to be adjusted has been specified as wiring resistance on the common lines CL0, CL1, and CL in the embodiments, this aspect of the present invention is not limited to it. That is, a similar manner of load adjustment can be made to common terminals such as drain terminals MOS transistors MY(0) through MY(n), drain terminals MOS transistors MZ(0) through MZ(n) in FIG. 2, and the like.

Furthermore, it is not always necessary to provide the selector 2(72) for sharing the load adjustor section 1 among the reference sections 27C. That is, it can be structured such that each reference section 27C and the load adjustor section 1 are connected directly. Alternatively, at least one of gate terminals of the MOS transistors and the reference cells in a reference section 27C may be controlled to selectively establish a current path for reference current Iref, whereby the load adjustor section 1 can be shared among the reference sections 27C.

According to the present invention there is provided a semiconductor memory device and a control method thereof capable of making margin of readout operation constant regardless of any memory cells by connecting load that depends on a selected memory cell to a reference cell wherein the number of reference cells is restrained to a minimum essential and reference current value of which depends on a selected memory cell is obtained.

What is claimed is:

1. A semiconductor memory device that differentially amplifies data readout from a memory cell with reference to a reference value when data is read out, the semiconductor memory device comprising:
   a reference cell; and
   a load adjustor section that adjusts a first load connected to a source terminal side of the reference cell in accordance with a selected address of the memory cell;
   wherein the first load is adjusted with reference to a second load on a data path of a source terminal side of the memory cell selected in accordance with the selected address.

2. A semiconductor memory device according to claim 1 wherein the load adjustor section includes a resister element.

3. A semiconductor memory device according to claim 1, wherein the first load is equivalent to the second load.

4. A semiconductor memory device according to claim 1, wherein the load adjustor section comprises a load element group that includes a plurality of load elements, and a selector section that selects predetermined at least one of the load elements as the first load from the load element group by the selected address.

5. A semiconductor memory device according to claim 4 further comprising a common-line path that connects between a plurality of the memory cells and a common terminal, wherein the load element group has load distribution that is equivalent with the common-line path, and the selector section connects each connection point of the load element group corresponding to each connection point of the common-line path to be connected with each of the memory cells is connected to the reference cell.

6. A semiconductor memory device according to claim 5, wherein the load element group is constituted by a wiring material having physical parameter equivalent with the common-line path in form of wiring geometry equivalent with the common-line path.

7. A semiconductor memory device according to claim 5, wherein impedance from a connection point of the common-line path of the common terminal is equivalent to impedance from a connection point of the load element group to the common terminal.

8. A semiconductor memory device according to claim 5, wherein the common terminal is a reference voltage terminal, and source terminal of the reference cell and source terminals of a plurality of the memory cells are connected to each connection point of the load element group and the common-line path.

9. A semiconductor memory device according to claim 4 further comprising a common-line path both ends of which are connected to a common terminal, the common-line path connecting with an exponential multiplier of 2 of the memory cells with constant interval taken, wherein the load element groups comprises: a first load element group in which predetermined number of second load elements are connected in series, the predetermined number of the second load elements being obtained by adding up first load elements arranged between adjoining point on the common-line path to which the memory cells are connected by exponential multiplier of 2; and a second load element group obtained by subtracting the second load element which is largest load from the first load element group, and the selector section exclusively selects some of the second load elements that mutually correspond to each other between the first load element group and the second load element group.

10. A semiconductor memory device according to claim 1 further comprising:

a first digit line to which a plurality of the memory cells are connected;

a second digit line to which a plurality of the memory cells are connected;

a first data line to which some of the memory cells not to be selected are connected through the first digit line;

a second data line to which one of the memory cells to be selected is connected through the second digit line;

a first loader section that comprises the reference cell and load adjustor section, and is connected to the first data line; and a second loader section that has equivalent constitution as the first loader section, and is connected to the second data line;

wherein readout operation is conducted using the first data line and the second data line as a pair.

11. A semiconductor memory device according to claim 1 further comprising:

a first digit line to which a plurality of the memory cells are connected;

a second digit line to which a plurality of the memory cells are connected;

a first data line to which some of the memory cells not to be selected are connected through the first digit line;

a second data line to which one of the memory cells to be selected is connected through the second digit line;

a first loader section that is connected to the first data line and supplies the reference value to the first data line;

a second loader section that has equivalent constitution as the first loader section, and is connected to the second data line; and a regulator section that comprises the reference cell and the load adjustor section and outputs regulate voltage in accordance with the reference value;

wherein the first loader section and the second loader section comprises a first load section and a second load section, respectively, that are controlled by the regulate voltage.

12. A semiconductor memory device according to claim 1 further comprising a plurality of readout operation modes, wherein predetermined readout operation modes among a plurality of the readout operation modes comprises the reference cell and the load adjustor section.

13. A semiconductor memory device according to claim 12, wherein, in case number of the predetermined readout operation modes is two or more, the load adjustor section is shared among the predetermined readout operation modes.

14. A semiconductor memory device according to claim 12, wherein, in case number of the predetermined readout operation modes is three or more, a first readout operation mode comprises a first load adjustor section, and other readout operation modes comprise a second load adjustor section mode that is shared among the other readout operation modes.

15. A semiconductor memory device according to claim 12, wherein the semiconductor memory device is non-volatile semiconductor memory device, and the predetermined readout operation mode is a data readout mode or at least one of readout operation modes out following two combinations, namely, the data readout mode and a program-verifying mode or the data readout mode and a delete-verify mode.

16. A semiconductor memory device according to claim 1, wherein the semiconductor memory device is a non-volatile semiconductor memory device, and the reference value is a reference current value.

17. A control method of a semiconductor memory device comprising the steps of:

a step for reading out data from a memory cell, and a step for differentially amplifying the data read out from the memory cell with reference to a reference value read out from a reference cell;

wherein the reference value is adjusted by adjusting a first load connected to a source terminal side of the reference cell with reference to a second load on a data path of a source terminal side of the memory cell selected by a selected address.

18. A control method of a semiconductor memory device according to claim 17, wherein the first load is equivalent with the second load.

* * * * *